United States Patent
Iwai et al.

(10) Patent No.: US 9,505,953 B2
(45) Date of Patent: Nov. 29, 2016

(54) TEMPORARY ADHESIVE FOR PRODUCTION OF SEMICONDUCTOR DEVICE, AND ADHESIVE SUPPORT AND PRODUCTION METHOD OF SEMICONDUCTOR DEVICE USING THE SAME

(71) Applicant: FUJIFILM Corporation, Tokyo (JP)

(72) Inventors: Yu Iwai, Shizuoka (JP); Kazuhiro Fujimaki, Shizuoka (JP); Ichiro Koyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/660,244

(22) Filed: Mar. 17, 2015

(65) Prior Publication Data
US 2015/0184033 A1 Jul. 2, 2015

Related U.S. Application Data

(63) Continuation of application No. PCT/JP2013/074346, filed on Sep. 10, 2013.

(30) Foreign Application Priority Data

Sep. 28, 2012 (JP) .................................. 2012-218584

(51) Int. Cl.
C09J 4/00 (2006.01)
H01L 21/304 (2006.01)
(Continued)

(52) U.S. Cl.
CPC .. *C09J 4/00* (2013.01); *C09J 4/06* (2013.01); *C09J 7/00* (2013.01); *C09J 7/02* (2013.01); *C09J 7/0217* (2013.01); *H01L 21/304* (2013.01); *H01L 21/30625* (2013.01);
(Continued)

(58) Field of Classification Search
None
See application file for complete search history.

(56) References Cited

U.S. PATENT DOCUMENTS 8,466,041 B2 6/2013 Kuroda et al.
8,911,583 B2 12/2014 Jakob
(Continued)

FOREIGN PATENT DOCUMENTS

| JP | 8-53655 A | 2/1996 |
|---|---|---|
| JP | 2001-226641 A | 8/2001 |

(Continued)

OTHER PUBLICATIONS

Notification dated Jun. 9, 2015, issued by the Japanese Intellectual Property Office in counterpart Japanese Application No. 2012-218584.
(Continued)

*Primary Examiner* — Jiong-Ping Lu
(74) *Attorney, Agent, or Firm* — Sughrue Mion, PLLC

(57) ABSTRACT

The invention is directed to a temporary adhesive containing (A) a polymer compound having a radical polymerizable group in its side chain, (B) a radical polymerizable monomer, and (C) a heat radical polymerization initiator, and a production method of semiconductor device having a member processed including: adhering a first surface of a member to be processed to a substrate through an adhesive layer formed from the temporary adhesive; conducting a mechanical or chemical processing on a second surface which is different from the first surface of the member to be processed to obtain the member processed; and releasing the first surface of the member processed from the adhesive layer.

5 Claims, 7 Drawing Sheets

(51) Int. Cl.
*C09J 7/00* (2006.01)
*C09J 4/06* (2006.01)
*H01L 21/683* (2006.01)
*C09J 7/02* (2006.01)
*H01L 21/306* (2006.01)
*H01L 21/3105* (2006.01)
*H01L 21/311* (2006.01)
*C09J 133/06* (2006.01)

(52) U.S. Cl.
CPC .. *H01L 21/31058* (2013.01); *H01L 21/31133* (2013.01); *H01L 21/6835* (2013.01); *H01L 21/6836* (2013.01); *C09J 133/06* (2013.01); *C09J 2203/326* (2013.01); *C09J 2400/22* (2013.01); *C09J 2433/00* (2013.01); *H01L 2221/6834* (2013.01); *H01L 2221/68318* (2013.01); *H01L 2221/68327* (2013.01); *H01L 2221/68381* (2013.01)

(56) References Cited

U.S. PATENT DOCUMENTS

| | | | |
|---|---|---|---|
| 2005/0173051 A1* | 8/2005 | Hatai | C09J 7/0207 156/247 |
| 2006/0269715 A1 | 11/2006 | Hatai et al. | |
| 2008/0200011 A1 | 8/2008 | Pillalamarri et al. | |
| 2010/0012263 A1* | 1/2010 | Oshima | C08G 18/672 156/247 |
| 2010/0043608 A1 | 2/2010 | Jakob | |
| 2010/0129989 A1* | 5/2010 | Kamiya | B32B 7/12 438/464 |
| 2010/0206479 A1 | 8/2010 | Pillalamarri et al. | |
| 2011/0136321 A1 | 6/2011 | Kuroda et al. | |
| 2011/0318938 A1 | 12/2011 | Takeuchi et al. | |

FOREIGN PATENT DOCUMENTS

| | | |
|---|---|---|
| JP | 2003-231875 A | 8/2003 |
| JP | 200523188 A | 1/2005 |
| JP | 2006111651 A | 4/2006 |
| JP | 2007-45939 A | 2/2007 |
| JP | 2007-161871 A | 6/2007 |
| JP | 2009-173796 A | 8/2009 |
| JP | 2009-528688 A | 8/2009 |
| JP | 2010-506406 A | 2/2010 |
| JP | 2010-248395 A | 11/2010 |
| JP | 201132412 A | 2/2011 |
| JP | 2011-52142 A | 3/2011 |
| JP | 2011-119427 A | 6/2011 |
| JP | 2011-219686 A | 11/2011 |
| JP | 2011-225814 A | 11/2011 |

OTHER PUBLICATIONS

Search Report dated Nov. 19, 2013 issued by the International Searching Authority in counterpart International Patent Application No. PCT/JP2013/074346 (PCT/ISA/210).

Written Opinion dated Nov. 19, 2013 issued by the International Searching Authority in counterpart International Patent Application No. PCT/JP2013/074346 (PCT/ISA/237).

Office Action dated Dec. 15, 2015, issued by the Japanese Intellectual Property Office in counterpart Japanese Application No. 2012-218584.

Office Action dated Sep. 22, 2016 in counterpart Korean Patent Application No. 10-2015-7007311.

* cited by examiner

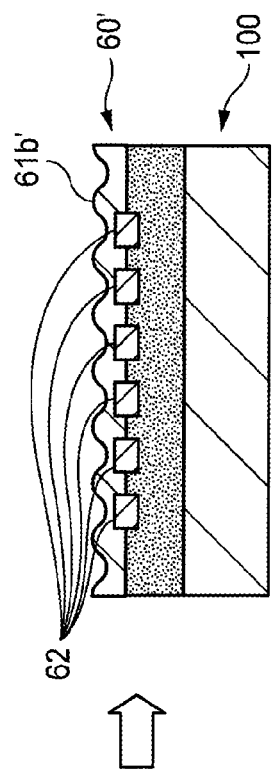
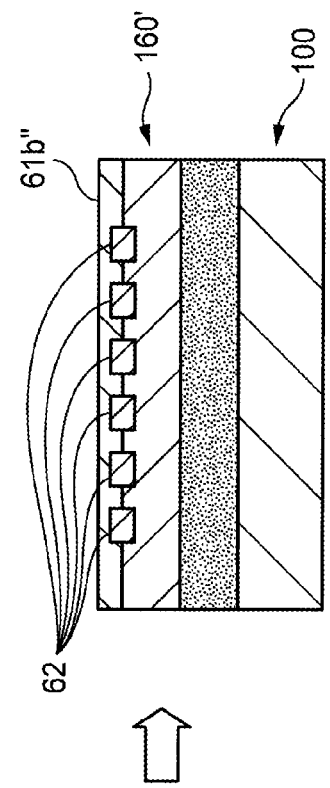
FIG. 4A
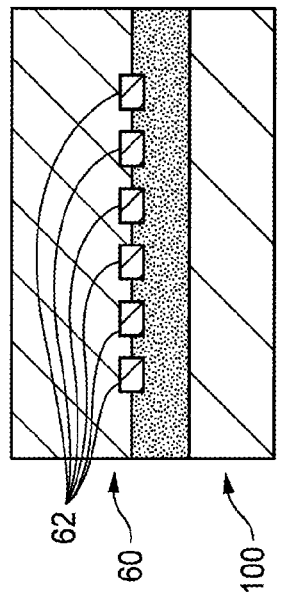
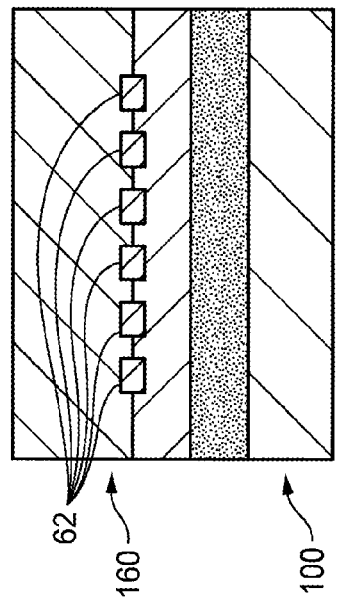
FIG. 4B

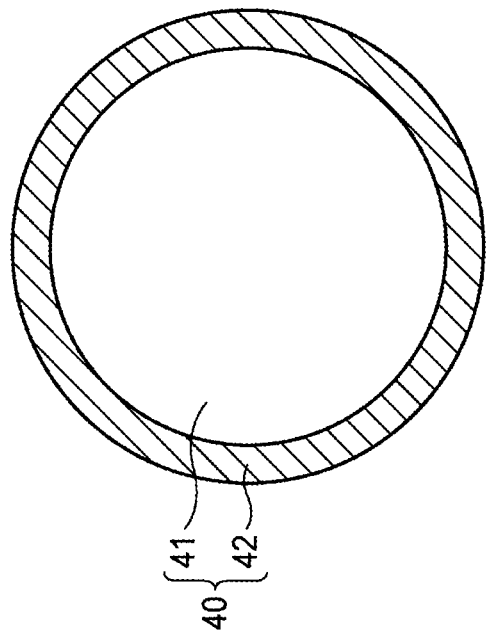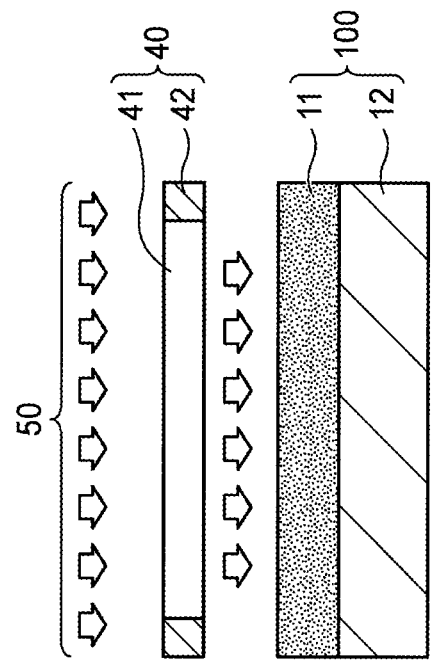

TEMPORARY ADHESIVE FOR PRODUCTION OF SEMICONDUCTOR DEVICE, AND ADHESIVE SUPPORT AND PRODUCTION METHOD OF SEMICONDUCTOR DEVICE USING THE SAME

CROSS REFERENCE TO RELATED APPLICATION

This is a continuation of International Application No. PCT/JP2013/074346 filed on Sep. 10, 2013, and claims priority from Japanese Patent Application No. 2012-218584 filed on Sep. 28, 2012, the entire disclosures of which are incorporated herein by reference.

TECHNICAL FIELD

The present invention relates to a temporary adhesive for production of semiconductor device, and an adhesive support and a production method of semiconductor device using the same.

BACKGROUND ART

Heretofore, in the production process of semiconductor device, for example, IC or LSI, ordinarily, a large number of IC chips are formed on a semiconductor silicon wafer and diced by dicing.

With the needs for further miniaturization and higher performance of electronic devices, further miniaturization and higher integration of IC chip mounted on the electronic device are requested, however, the high integration of the integrated circuit in the plane direction of a silicon substrate is close to the limit As an electrical connection method from an integrated circuit in an IC chip to an external terminal of the IC chip, a wire bonding method has been heretofore widely known. In order to reduce the size of the IC chip, in recent years, a method where a through hole is provided in a silicone substrate and a metal plug, as the external terminal is connected to the integrated circuit so as to pass through the through hole (method of forming a so-called through-silicon electrode (TSV)) is known. However, according to the method of forming a through silicon-electrode alone, the needs of higher integration for IC chip in recent years as described above are not sufficiently fulfilled.

In the light of the above, a technique of improving the integration density per unit area of the silicon substrate by making the integrated circuit in IC chip multi-layered is known. However, since the multi-layered integrated circuit increases the thickness of the IC chip, reduction in the thickness of members constituting the IC chip is required. As to the reduction in the thickness of the member, for example, reduction in the thickness of the silicon substrate has been studied and is promising not only to lead to the miniaturization of IC chip but also to save labor in a through-hole producing step of the silicon substrate in the production of through-silicon electrode.

As a semiconductor silicon wafer used in a production process of semiconductor device, the semiconductor silicon wafer having a thickness from about 700 to about 900 μm is widely known. In recent years, for the purpose of miniaturization of IC chip, it has been attempted to reduce the thickness of semiconductor silicon wafer to 200 μm or less.

However, since the semiconductor silicon wafer having the thickness of 200 μm or less is very thin and thus, a member for producing semiconductor device using the semiconductor silicon wafer as a base material is also very thin, and in the case where the member is subjected to further processing or where the member is simply moved, it is difficult to support the member stably and without imparting damage to the member.

In order to solve the problem described above, a technique is known wherein a semiconductor wafer having a device provided on the surface thereof before thinning and a supporting substrate for processing is temporarily adhered to a supporting substance for processing with a silicone adhesive, a back surface of the semiconductor wafer is ground to make it thin, the semiconductor wafer is punched to provide a through-silicon electrode, and then the supporting substrate for processing is released from the semiconductor wafer (see Patent Document 1). It is described that according to the technique, resistance to grinding at the grind of back surface of the semiconductor wafer, heat resistance in an anisotropic dry etching step or the like, chemical resistance at plating and etching, smooth final release from the supporting substrate for processing and a low adherend contamination property are able to be achieved at the same time.

Also, as a method of supporting a wafer, a technique is known which is a method for supporting a wafer by a support layer system, wherein between the wafer and the support layer system, a plasma polymer layer obtained by a plasma deposition method is interposed as a separation layer, and an adhesive strength between the support layer system and the separation layer is made larger than an adhesive strength between the wafer and the separation layer so as to be easily released the wafer from the separation layer when the wafer is released from the support layer system (see Patent Document 2).

Also, a technique of performing temporary adhesion using a polyethersulfone and a viscosity imparting agent, and then releasing the temporary adhesion with heating is known (see Patent Document 3).

Also, a technique of performing temporary adhesion with a mixture composed of a carboxylic acid and an amine, and then releasing the temporary adhesion with heating is known (see Patent Document 4).

Also, a technique is known wherein a device wafer and a supporting substrate are bonded with pressure to be adhered in a state where an adhesion layer composed of a cellulose polymer and the like is heated, and then the device wafer is released from the supporting substrate by laterally sliding under heating (see Patent Document 5).

Also, an adhesion film composed of syndiotactic 1,2-polybutadiene and a photopolymerization initiator, an adhesive force of which is changed by irradiation of radiation is known (see Patent Document 6).

Further, a technique is known wherein a supporting substrate and a semiconductor wafer are temporary adhered with an adhesive composed of a polycarbonate, the semiconductor wafer is subjected to processing, and by irradiating active energy ray and then heating, the semiconductor wafer processed is released from the supporting substrate (see Patent Document 7).

Also, an adhesive tape which is composed of an adhesive layer formed from an adhesive composition comprising an energy radiation curable copolymer having an energy radiation polymerizable unsaturated group in its side chain, an epoxy resin, and a thermally active latent epoxy resin curing agent and an adhesive force of which is changed by irradiation of radiation is known (see Patent Document 8).

As a similar technique, an adhesive agent composition containing an acrylic polymer having a weight average molecular weight from 30,000 to 2,000,000 and an unsaturated hydrocarbon group, an epoxy thermosetting resin having an unsaturated hydrocarbon group, and a heat curing agent is also known (see Patent Document 9).

PRIOR ART DOCUMENT

Patent Document

Patent Document 1: JP-A-2011-119427 (the term "JP-A" as used herein means an "unexamined published Japanese patent application")
Patent Document 2: JP-T-2009-528688 (the term "JP-T" as used herein means a published Japanese translation of a PCT patent application)
Patent Document 3: JP-A-2011-225814
Patent Document 4: JP-A-2011-52142
Patent Document 5: JP-T-2010-506406
Patent Document 6: JP-A-2007-45939
Patent Document 7: U.S. Patent Publication No. 2011/0318938
Patent Document 8: JP-A-8-53655
Patent Document 9: JP-A-2009-173796

DISCLOSURE OF THE INVENTION

Problems that the Invention is to Solve

In the case where a surface of semiconductor wafer provided with a device (that is, a device surface of device wafer) and a supporting substrate (that is, a carrier substrate) are temporarily adhered through a layer composed of the adhesive known in Patent Document 1 or the like, the adhesion of a certain strength is required for the adhesive layer in order to stably support the semiconductor wafer.

Therefore, in the case where the whole device surface of the semiconductor wafer and the supporting substrate are temporarily adhered through the adhesive layer, when the temporary adhesion between the semiconductor wafer and the supporting substrate is made sufficient in order to support the semiconductor wafer stably and without imparting damage to the semiconductor wafer, due to the too strong temporary adhesion between the semiconductor wafer and the supporting substrate, on the other hand, a disadvantage in that the device is damaged or in that the device is released from the semiconductor wafer is likely to occur, when the semiconductor wafer is released from the supporting substrate.

Also, the method of forming as a separation layer, a plasma polymer layer by a plasma deposition method between the wafer and the support layer system as in Patent Document 2 in order to prevent that the adhesion between the wafer and the support layer system becomes too strong has problems (1) in that the equipment cost for performing the plasma deposition method is ordinarily high, (2) in that the layer formation by the plasma deposition method takes time for vacuumization in the plasma apparatus and deposition of monomer, and (3) in that even when the separation layer composed of a plasma polymer layer is provided, it is not easy to control the adhesive strength in such a manner that the wafer is easily released from the separation layer in the case of releasing the supporting of wafer, while, on the other hand, the adhesive strength between the wafer and the separation layer maintains sufficiently in the case of supporting the wafer subjected to the processing.

Also, the method of releasing the temporary adhesion with heating as described in Patent Documents 3, 4 and 5, a disadvantage in that the device is damaged is likely to occur, when the semiconductor wafer is released.

Also, in the method of releasing the temporary adhesion by irradiation of active energy ray as described in Patent Documents 6, 7, 8 and 9, it is required to use a supporting substrate which transmits the active energy ray.

The invention has been made in the light of the background described above, and an object of the invention is to provide a temporary adhesive for production of semiconductor device, which not only can temporarily support a member to be processed (for example, a semiconductor wafer) with a high adhesive force when the member to be processed is subjected to a mechanical or chemical processing, but also can easily release (with high releasing property) the temporary support for the member processed without imparting damage to the member processed, and an adhesive support and a production method of semiconductor device using the same.

Means for Solving the Problems

As a result of the intensive investigations to solve the problems described above, the inventors have found that when a composition containing (A) a polymer compound having a radical polymerizable group in its side chain, (B) a radical polymerizable monomer, and (C) a heat radical polymerization initiator is used as a temporary adhesive in a temporary adhesion step of a semiconductor wafer and a supporting substrate, not only a member to be processed can be temporarily supported with a high adhesive force, but also after processing the member to be processed, the temporary support for the member processed can be easily released by bringing the adhesive layer into contact with a release solvent without conducting the heating or the irradiation of active light or radiation as conducting in the prior art described above, although the reason for this is not quite clear, to complete the invention. Specifically, the invention includes the following items.

[1] A temporary adhesive for production of semiconductor device containing (A) a polymer compound having a radical polymerizable group in its side chain, (B) a radical polymerizable monomer, and (C) a heat radical polymerization initiator.

[2] The temporary adhesive for production of semiconductor device as described in [1], wherein the polymer compound (A) contains at least one group selected from the group consisting of a group represented by formula (1) shown below, a group represented by formula (2) shown below and a group represented by formula (3) shown below, as the radical polymerizable group:

Formula (1)

Formula (2)

Formula (3)

in the formulae, X and Y each independently represents an oxygen atom, a sulfur atom or —N(R$^{12}$)—, Z represents an oxygen atom, a sulfur atom, —N(R$^{13}$)— or a phenylene group, and $R^1$ to $R^{12}$ each independently represents a hydrogen atom or a monovalent substituent.

[3] The temporary adhesive for production of semiconductor device as described in [2], wherein the polymer compound (A) contains the group represented by formula (1) shown above, as the radical polymerizable group.

[4] The temporary adhesive for production of semiconductor device as described in any one of [1] to [3], wherein a thermal decomposition temperature of the heat radical polymerization initiator (C) is from 130 to 250° C.

[5] The temporary adhesive for production of semiconductor device as described in any one of [1] to [4], wherein the heat radical polymerization initiator (C) is a nonionic heat radical polymerization initiator.

[6] The temporary adhesive for production of semiconductor device as described in any one of [1] to [5], which further contains (D) a photo-radical polymerization initiator.

[7] The temporary adhesive for production of semiconductor device as described in [6], wherein the photo-radical polymerization initiator (D) is a nonionic photo-radical polymerization initiator.

[8] The temporary adhesive for production of semiconductor device as described in any one of [1] to [7], wherein the polymer compound (A) does not include an acid group.

[9] An adhesive support comprising a substrate and on the substrate an adhesive layer formed from the temporary adhesive for production of semiconductor device as described in any one of [1] to [8].

[10] A production method of semiconductor device having a member processed comprising a step of adhering a first surface of a member to be processed to a substrate through an adhesive layer formed from the temporary adhesive for production of semiconductor device as described in any one of [1] to [8], a step of conducting a mechanical or chemical processing on a second surface which is different from the first surface of the member to be processed to obtain the member processed, and a step of releasing the first surface of the member processed from the adhesive layer.

The production method of semiconductor device as described in [10], which further comprises a step of irradiating active light or radiation, or heat to a surface of the adhesive layer which is to be adhered to the first surface of a member to be processed, before the step of adhering a first surface of a member to be processed to a substrate through the adhesive layer.

[12] The production method of semiconductor device as described in [10] or [11], which further comprises a step of heating the adhesive layer at a temperature from 50 to 300° C., after the step of adhering a first surface of a member to be processed to a substrate through the adhesive layer and before the step of conducting a mechanical or chemical processing on a second surface which is different from the first surface of the member to be processed to obtain the member processed.

[13] The production method of semiconductor device as described in any one of [10] to [12], wherein the step of releasing the first surface of the member processed from the adhesive layer includes a step of bringing the adhesive layer into contact with a release solution.

[14] The production method of semiconductor device as described in any one of [10] to [13], wherein the member to be processed comprises a substrate to be processed and a protective layer provided on a first surface of the substrate to be processed, a surface of the protective layer opposite to the substrate to be processed is the first surface of the member to be processed, and a second surface which is different from the first surface of the substrate to be processed is the second surface of the substrate to be processed.

Advantage of the Invention

According to the invention, a temporary adhesive for production of semiconductor device, which not only can temporarily support a member to be processed with a high adhesive force when the member to be processed is subjected to a mechanical or chemical processing, but also can easily release the temporary support for the member processed without imparting damage to the member processed, and an adhesive support and a production method of semiconductor device using the same can be provided.

BRIEF DESCRIPTION OF THE DRAWING

FIG. 4A and FIG. 4B are a schematic cross-sectional view illustrating a state in which the device wafer temporarily adhered by the adhesive support is thinned and a schematic cross-sectional view illustrating a state in which the device wafer provided with a protective layer temporarily adhered by the adhesive support is thinned, respectively.

FIG. 5A shows a schematic cross-sectional view illustrating exposure of the adhesive support, and FIG. 5B shows a schematic top view of a mask.

MODE FOR CARRYING OUT THE INVENTION

Figure 1A:
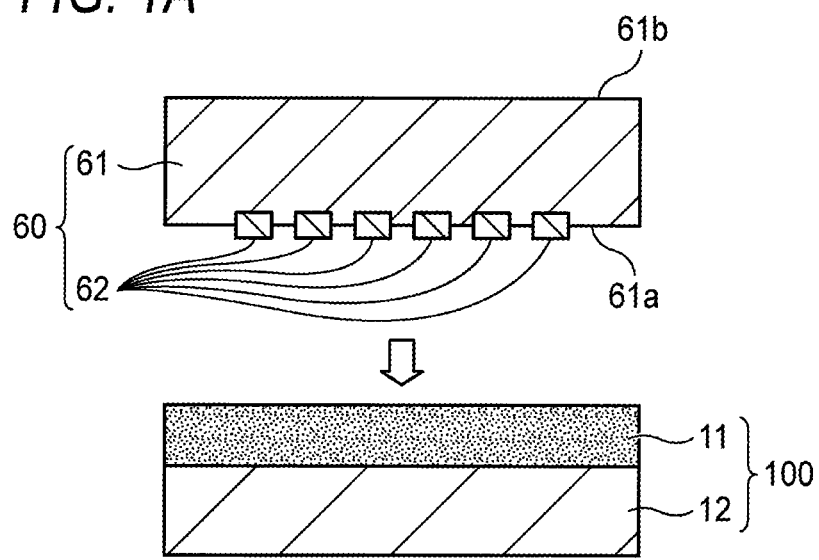
FIG. 1A and FIG. 1B are a schematic cross-sectional view illustrating temporary adhesion of an adhesive support and a device wafer and a schematic cross-sectional view showing a state in which the device wafer temporarily adhered by the adhesive support is thinned, respectively.

Embodiments of the invention will be described in detail hereinafter.

In the description of a group (atomic group) in the specification, when the group is described without specifying whether the group is substituted or unsubstituted, the group includes both a group (atomic group) having no substituent and a group (atomic group) having a substituent. For example, "an alkyl group" includes not only an alkyl group which has no substituent (an unsubstituted alkyl group) but also an alkyl group which has a substituent (a substituted alkyl group).

In the specification, the term "active light" or "radiation" includes, for example, visible light, an ultraviolet ray, a far ultraviolet ray, an electron beam and an X-ray. Also, the term "light" as used in the invention means active light or radiation.

Also, the term "exposure" in the specification includes, unless otherwise specified, not only exposure by a mercury lamp, an ultraviolet ray, a far ultraviolet ray represented by an excimer laser, an X-ray, EUV light or the like, but also drawing by a particle ray, for example, an electron beam or an ion beam.

Also, in the specification, the term "(meth)acrylate" represents both or either of acrylate and methacrylate, the term "(meth)acryl" represents both or either of acryl and methacryl, and the term "(meth)acryloyl" represents both or either of acryloyl and methacryloyl. Also, in the specification, the terms "monomer" and "monomer" have the same meaning. A monomer according to the invention is distinguished from an oligomer and a polymer, and means a compound having a weight average molecular weight of 2,000 or less. In the specification, a polymerizable compound indicates a compound having a polymerizable group, and may be a monomer or a polymer. The polymerizable group denotes a group which is involved in a polymerization reaction.

In the embodiments described below, the member or the like described in the drawing already referred to is indicated by the same or corresponding symbol in the figure and its description is simplified or omitted.

The temporary adhesive for production of semiconductor device (hereinafter, also simply referred to as a "temporary adhesive") according to the invention contains (A) a polymer compound having a radical polymerizable group in its side chain, (B) a radical polymerizable monomer, and (C) a heat radical polymerization initiator.

In accordance with the temporary adhesive for production of semiconductor device according to the invention, a temporary adhesive for production of semiconductor device which not only can temporarily support a member to be processed with a high adhesive force when the member to be processed is subjected to a mechanical or chemical processing, but also can release the temporary support for the member processed without imparting damage to the member processed can be obtained.

The temporary adhesive for production of semiconductor device according to the invention is preferred for forming a through-silicon electrode. The formation of through-silicon electrode will be described in detail later.

Hereinafter, the components which the temporary adhesive for production of semiconductor device according to the invention contains will be described in detail.

(A) Polymer Compound having Radical Polymerizable Group in its Side Chain

The polymer compound (A) which is used in the temporary adhesive for production of semiconductor device according to the invention includes, for example, a (meth)acrylic polymer, a styrene polymer, a polyurethane resin, a polyvinyl alcohol resin, a polyvinyl acetal resin (for example, a polyvinyl butyral resin), a polyvinyl formal resin, a polyamide resin, a polyester resin, an epoxy resin and a novolac resin, and has a radical polymerizable group in its side chain.

The polymer compound (A) is ordinarily synthesized by polymerization of a monomer having a polymerizable partial structure by radical polymerization or the like and contains a repeating unit derived from the monomer having a polymerizable partial structure. The monomer having a polymerizable partial structure includes, for example, an ethylenically polymerizable partial structure.

From the standpoint of production method of the polymer compound having a radical polymerizable group in its side chain, a (meth)acrylic polymer or a polyurethane resin can be preferably used.

The radical polymerizable group had by the polymer compound (A) means a group capable of polymerizing by an action of a radical.

By introducing the radical polymerizable group into the polymer compound, when a heat treatment is conducted after adhering the adhesive support to a member to be processed, the polymerization reaction more proceeds by a radical generated from the heat radical polymerization initiator so that the member to be processed can be temporarily supported with a higher adhesive force.

On the other hand, for example, when pattern exposure is conducted to the adhesive layer of adhesive support before adhering the adhesive support to a member to be processed as described later, the polymerization reaction proceeds in the exposed area to provide a high adhesive region and a low adhesive region in the adhesive layer.

Also, for example, when active light or radiation, or heat is irradiated to the adhesive layer of adhesive support before adhering the adhesive support to a member to be processed, due to the radical polymerizable group of the polymer compound the polymerization reaction proceeds to form the adhesive layer in which the adhesion property decreases from the inner surface on the substrate side to the outer surface. Specifically, the adhesion property of the adhesive layer to the member to be processed can be decreased while maintaining high adhesion property between the substrate and the adhesive layer in the adhesive support.

The radical polymerizable group is preferably, for example, a functional group capable of undergoing an addition polymerization reaction. The functional group capable of undergoing an addition polymerization reaction includes an ethylenically unsaturated group. The ethylenically unsaturated group preferably includes a styryl group, an allyl group, a (meth)acryloyl group, a vinyl group, a vinyloxy group and an alkynyl group. Among them, a (meth)acryloyl group is particularly preferred from the standpoint of adhesion property.

In the polymer compound (A), for example, a free radical (a polymerization initiating radical or a propagating radical in the process of polymerization of the polymerizable compound) is added to the polymerizable group to cause addition polymerization between the polymer compounds directly or through a polymerization chain of the polymerizable monomer and as a result, crosslinking is formed between the molecules of the polymer compounds to effect curing. Alternatively, an atom (for example, a hydrogen atom on the carbon atom adjacent to the functional crosslinkable group) in the polymer compound is withdrawn by a free radical to produce a radical and the radicals combine with each other to form crosslinking between the molecules of the polymer compounds to effect curing.

Specifically, the polymer compound (A) preferably contains as the radical polymerizable group, at least one group selected from the group consisting of a group represented by formula (1) shown below, a group represented by formula (2) shown below and a group represented by formula (3) shown below, and more preferably contains a group represented by formula (1) shown below.

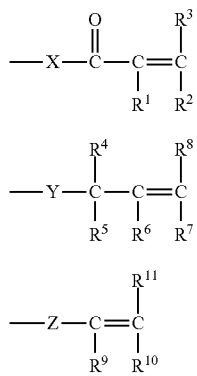

Formula (1)

Formula (2)

Formula (3)

In the formulae, X and Y each independently represents an oxygen atom, a sulfur atom or —N($R^{12}$)—, Z represents an oxygen atom, a sulfur atom, —N($R^{12}$)— or a phenylene group, and $R^1$ to $R^{12}$ each independently represents a hydrogen atom or a monovalent substituent.

In formula (1), $R^1$ to $R^3$ each independently represents a hydrogen atom or a monovalent substituent. For example, $R^1$ includes a hydrogen atom and a monovalent organic group, for example, an alkyl group which may have a substituent, and $R^1$ is preferably a hydrogen atom, a methyl group, a methylalkoxy group or a methyl ester group. $R^2$ and $R^3$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent, and $R^2$ and $R^3$ each is preferably a hydrogen atom, a carboxyl group, an alkoxycarbonyl group, an alkyl group which may have a substituent or an aryl group which may have a substituent. The substituent to be introduced includes a methoxycarbonyl group, an ethoxycarbonyl group, an isopropoxycarbonyl group, a methyl group, an ethyl group and a phenyl group. X represents an oxygen atom, a sulfur atom or —N($R^{12}$)—, and $R^{12}$ includes, for example, a hydrogen atom and an alkyl group which may have a substituent.

In formula (2), $R^4$ to $R^8$ each independently represents a hydrogen atom or a monovalent substituent, and each includes a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent, and $R^4$ to $R^8$ each is preferably a hydrogen atom, a carboxyl group, an alkoxycarbonyl group, an alkyl group which may have a substituent or an aryl group which may have a substituent. The substituent to be introduced includes the substituents described in formula (1). Y represents an oxygen atom, a sulfur atom or —N($R^{12}$)—, and $R^{12}$ includes those described in formula (1).

In formula (3), $R^9$ to $R^{11}$ each independently represents a hydrogen atom or a monovalent substituent, and each includes a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent, and $R^9$ to $R^{11}$ each is preferably a hydrogen atom, a carboxyl group, an alkoxycarbonyl group, an alkyl group which may have a substituent or an aryl group which may have a substituent. The substituent to be introduced includes the substituents described in formula (1). Z represents an oxygen atom, a sulfur atom, —N($R^{12}$)— or a phenylene group, and $R^{12}$ includes those described in formula (1). Of the radical polymerizable groups, a radical polymerizable group having a methacryloyl group represented by formula (1) is preferred.

In the case of introducing a structural unit having the radical polymerizable group (for example, an ethylenically unsaturated group) into the polymer compound (A), the content thereof is preferably from 0.1 to 10.0 mmol, more preferably from 1.0 to 7.0 mmol, most preferably from 2.0 to 5.5 mmol, per g of the polymer compound (A) in accordance with iodine titration (measurement of the content of radical polymerizable group). In the range described above, good sensitivity and good preservation stability are obtained.

The polymer compound (A) typically contains a repeating unit having the radical polymerizable group, and the content of the repeating unit having the radical polymerizable group in such a case is preferably from 1 to 70% by mole, more preferably from 2 to 60% by mole, still more preferably from 5 to 50% by mole, based on the total repeating units of the polymer compound (A).

The radical polymerizable group can be introduced by (a) a urethanization reaction using a hydroxy group of the polymer side chain and an isocyanate having the radical polymerization reactive group, (b) an esterification reaction using a hydroxy group of the polymer side chain and a carboxylic acid, carboxylic halide, sulfonic halide or carboxylic anhydride having the radical polymerization reactive group, (c) a reaction using a carboxyl group or salt thereof of the polymer side chain and an isocyanate having the radical polymerization reactive group, (d) an esterification reaction using a halogenated carbonyl group, carboxyl group or salt thereof of the polymer side chain and an alcohol having the radical polymerization reactive group, (e) an amidation reaction using a halogenated carbonyl group, carboxyl group or salt thereof of the polymer side chain and an amine having the radical polymerization reactive group, (f) an amidation reaction using an amino group of the polymer side chain and a carboxylic acid, carboxylic halide, sulfonic halide or carboxylic anhydride having the radical polymerization reactive group, (g) a ring opening reaction between an epoxy group of the polymer side chain and various nucleophilic compounds having the radical polymerization reactive group, or (h) an etherification reaction between a haloalkyl group of the polymer side chain and an alcohol having the radical polymerization reactive group.

The polymer compound (A) preferably contains a repeating unit having at least one of the groups represented by formulae (1) to (3). Specifically, such a repeating unit is preferably a repeating unit represented by formula (4) shown below.

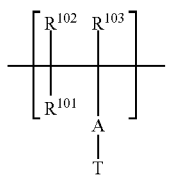

Formula (4)

In formula (4), $R^{101}$ to $R^{103}$ each independently represents a hydrogen atom, an alkyl group having from 1 to 6 carbon atoms or a halogen atom. T represents the radical polymerizable group represented by any one of formulae (1) to (3) described above, and preferred embodiments thereof are also same as those described for the radical polymerizable group above.

In formula (4), A represents a single bond or a divalent connecting group selected from the group consisting of —CO—, —O—, —NH—, a divalent aliphatic group, a divalent aromatic group and a combination thereof. Specific examples $L^1$ to $L^{18}$ of the combination of groups represented by A are set forth below. In each of the specific examples shown below, the left side connects to the main chain and the right side connects to the radical polymerizable group represented by any one of formulae (1) to (3) described above.

$L^1$: —CO—NH-divalent aliphatic group-O—CO—NH-divalent aliphatic group-
$L^2$: —CO—NH-divalent aliphatic group-
$L^3$: —CO-divalent aliphatic group-
$L^4$: —CO—O-divalent aliphatic group-
$L^5$: -divalent aliphatic group-
$L^6$: —CO—NH-divalent aromatic group-
$L^7$: —CO-divalent aromatic group-
$L^8$: -divalent aromatic group-
$L^9$: —CO—O-divalent aliphatic group-CO—O-divalent aliphatic group-
$L^{10}$: —CO—O-divalent aliphatic group-O—CO-divalent aliphatic group-
$L^{11}$: —CO—O-divalent aromatic group-CO—O-divalent aliphatic group-
$L^{12}$: —CO—O-divalent aromatic group-O—CO-divalent aliphatic group-
$L^{13}$: —CO—O-divalent aliphatic group-CO—O-divalent aromatic group-O—CO—
$L^{14}$: —CO—O-divalent aliphatic group-O—CO-divalent aromatic group-
$L^{15}$: —CO—O-divalent aromatic group-CO—O-divalent aromatic group-
$L^{16}$: —CO—O-divalent aromatic group-O—CO-divalent aromatic group-
$L^{17}$: —CO—O-divalent aromatic group-O—CO—NH-divalent aliphatic group-
$L^{18}$: —CO—O-divalent aliphatic group-O—CO—NH-divalent aliphatic group- In the above, the divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferred, and an alkylene group and a substituted alkylene group are more preferred.

Of the divalent aliphatic groups, a chain structure is preferred than a cyclic structure, and further a straight-chain structure is preferred than a chain structure having a branch. A number of carbon atoms included in the divalent aliphatic group is preferably from 1 to 20, more preferably from 1 to 15, still more preferably from 1 to 12, yet still more preferably from 1 to 10, even yet still more preferably from 1 to 8, and particularly preferably from 1 to 4.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, an arylamino group and a diaryl amino group.

The divalent aromatic group includes, for example, a phenylene group, a substituted phenylene group, a naphthylene group and a substituted naphthylene group, and a phenylene group is preferred.

Examples of the substituent for the divalent aromatic group include an alkyl group in addition to the substituents described for the divalent aliphatic group above.

For the purpose of increasing various performances, for example, an adhesion strength, the polymer compound (A) preferably contains other repeating unit in addition to the repeating unit having a radical polymerizable group as long as the effects of the invention are not impaired. In the case of a polymer compound capable of being synthesized by radical polymerization as a (meth)acrylic polymer, it is preferred to copolymerize a radical polymerizable monomer in order to add the other repeating unit. The monomer to be copolymerized includes a monomer selected, for example, from an acrylic acid ester, a methacrylic acid ester, an N,N-disubstituted acrylamide, an N,N-disubstituted methacrylamide, a styrene, an acrylonitrile and a methacrylonitrile.

Specifically, for instance, an acrylic acid ester, for example, an alkyl acrylate (preferably having from 1 to 20 carbon atoms in the alkyl group thereof, for example, methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate) or an aryl acrylate (for example, phenyl acrylate), a methacrylic acid ester, for example, an alkyl methacrylate (preferably having from 1 to 20 carbon atoms in the alkyl group thereof, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate) or an aryl methacrylate (for example, phenyl methacrylate, cresyl methacrylate or naphthyl methacrylate), styrene, an alkylstyrene (for example, methylstyrene, dimethylstyrene, trimethylstyrene, ethylstyrene, diethylstyrene, isopropylstyrene, burylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (for example, methoxystyrene, 4-methoxy-3-methylstyrene or dimethoxystyrene), a halogenostyrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile and methacrylonitrile are exemplified.

Also, the polymer compound (A) is preferably substantially insoluble in an alkali solution from the standpoint of resistance to the alkali solution which is likely to contact at the production of semiconductor device.

The term "substantially insoluble in an alkali solution" as used herein indicates that when only the polymer compound (A) is dissolved in a solvent, for example, butyl acetate to prepare a composition having a solid component concentration of 3.5% by weight, the composition is coated on a silicon wafer to form a film (having a thickness of 100 nm), and the film is immersed in a 2.38% by weight tetramethylammonium hydroxide (TMAH) aqueous solution at room temperature (25° C.) for 1,000 seconds, an average dissolution rate (decreasing rate of film thickness) measured, for example, by QCM (crystal oscillator microbalance) sensor is 1 nm/sec or less. The average dissolution rate is preferably 0.1 nm/sec or less.

Since it is preferred that the polymer compound (A) is substantially alkali-insoluble as described above, the polymer compound (A) may or may not have an acid group, but preferably does not have an acid group.

The acid group includes, for example, a carboxyl group, a sulfonamido group, a sulfonylimido group, a bissulfonylimido group and an aliphatic alcohol group substituted at its α-position with an electron withdrawing group (for example, a hexafluoroisopropanol group or —C(CF$_3$)$_2$OH).

In the case where the polymer compound (A) has an acid group, the polymer compound (A) preferably contains a repeating unit having the acid group, and in such a case the content of the repeating unit having an acid group in the polymer compound (A) is preferably 25% by mole or less, more preferably 15% by mole or less, and still more preferably 10% by mole or less. The content of the repeating unit having an acid group in the polymer compound (A) is ordinarily 1% by mole or more. The electron-withdrawing group is a substituent having a tendency to attract an electron, for example, a substituent having a tendency to attract an electron from an atom which is positioned adjacent to the substituent in the molecule.

The weight average molecular weight (Mw) of the polymer compound (A) is preferably 2,500 or more, more preferably from 2,500 to 1,000,000, still more preferably from 5,000 to 1,000,000, in terms of polystyrene according to a GPC method. The dispersity (weight average molecular weight/number average molecular weight) of the polymer compound (A) is preferably from 1.1 to 10.

The GPC method is based on a method using HLC-8020GPC (produced by Tosoh Corp.), TSKgel Super HZM-H, TSKgel Super HZ4000 and TSKgel Super HZ2000 (produced by Tosoh Corp., 4.6 mm ID×15 cm) as columns, and THF (tetrahydrofuran) as a eluent.

The polymer compounds (A) may be used in combination of two or more thereof, if desired.

The content of the polymer compound (A) is preferably from 5 to 95% by weight, more preferably from 10 to 90% by weight, still more preferably from 20 to 80% by weight, based on the total solid content of the temporary adhesive for production of semiconductor device from the standpoint of good adhesion strength.

Specific examples of the polymer compound (A) are set forth below, but the invention should not be construed as being limited thereto. The composition ratio of the polymer structure is indicated by a mole percentage.

(1)
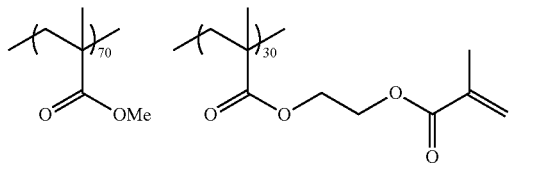
Mw: 45,000

(2)
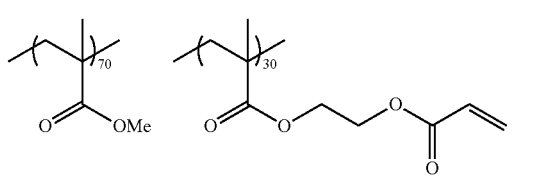
Mw: 36,000

(3)
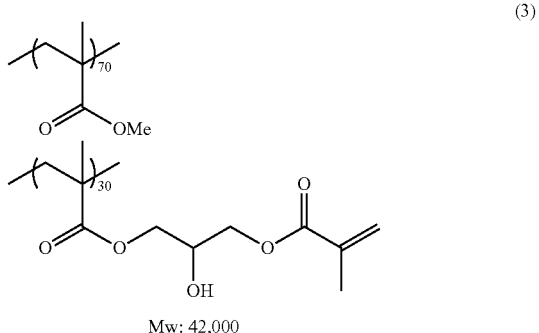
Mw: 42,000

(4)
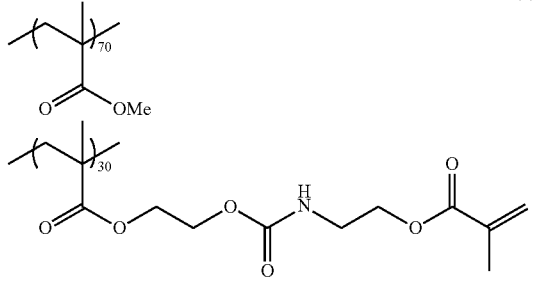
Mw: 29,000

(5)
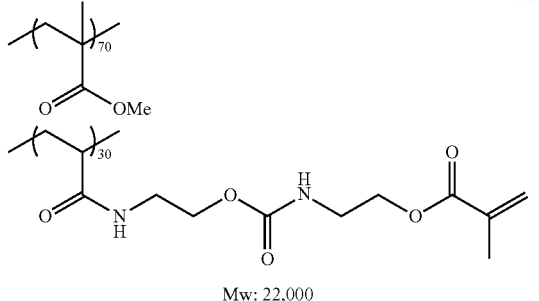
Mw: 22,000

(6)

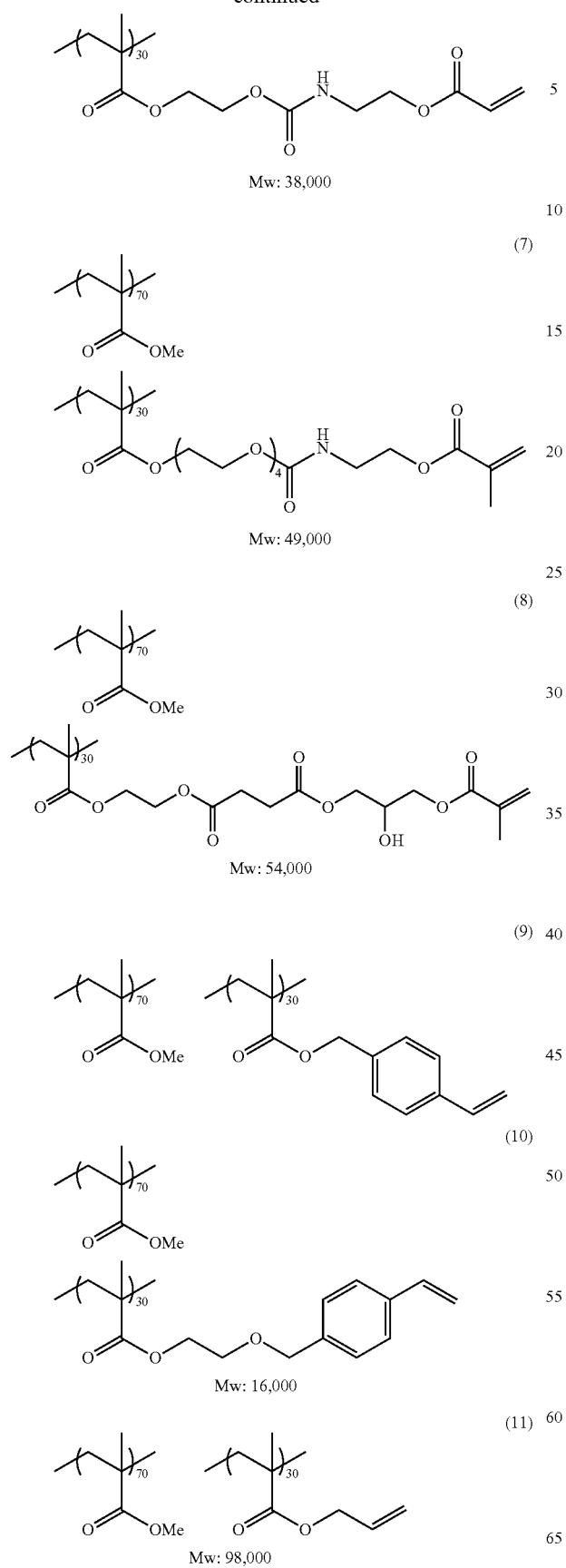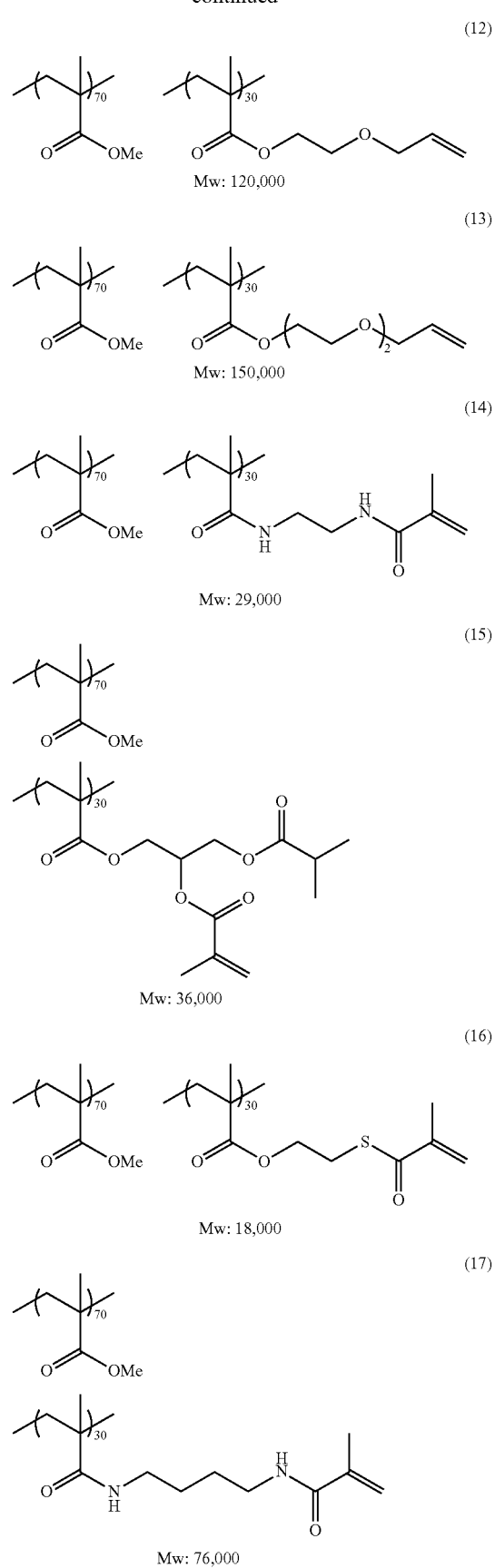

(18)
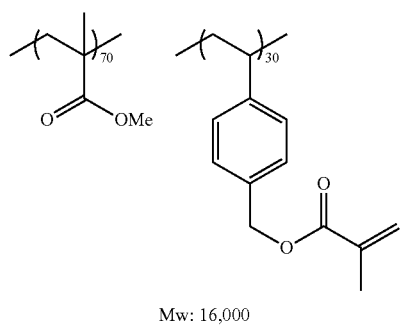
Mw: 16,000
(19)
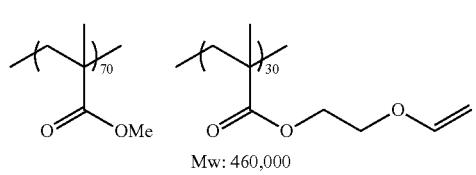
Mw: 460,000
(20)
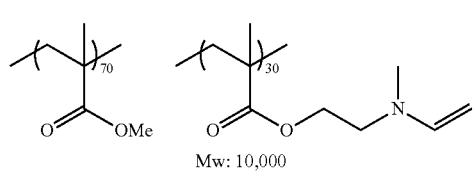
Mw: 10,000
(21)
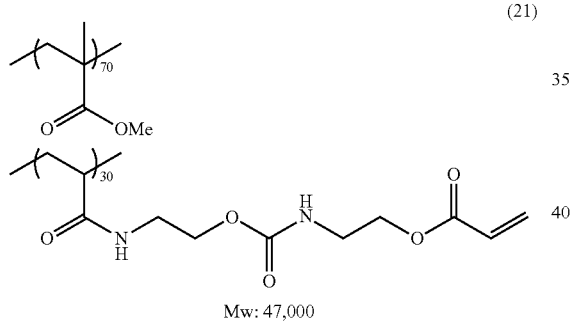
Mw: 47,000
(22)
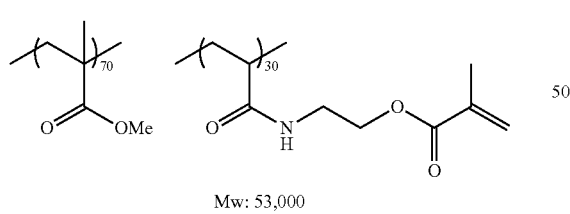
Mw: 53,000
(23)
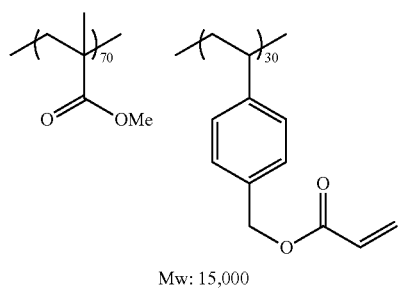
Mw: 15,000
(24)
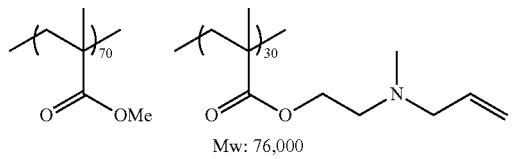
Mw: 76,000
(25)
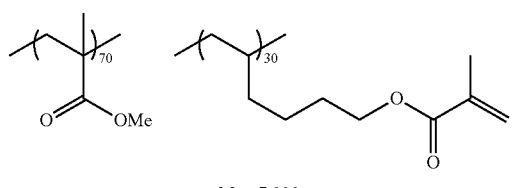
Mw: 7,000
(26)
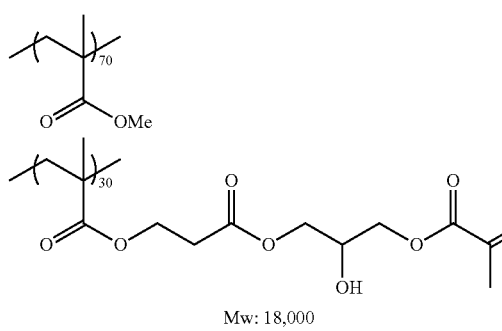
Mw: 18,000
(27)
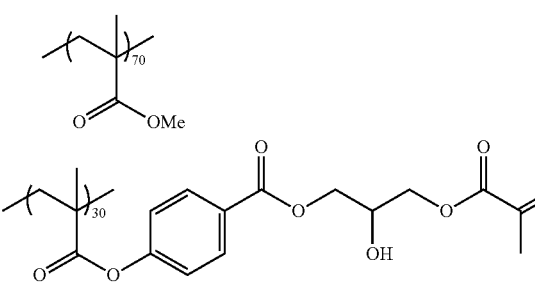
Mw: 30,000
(28)
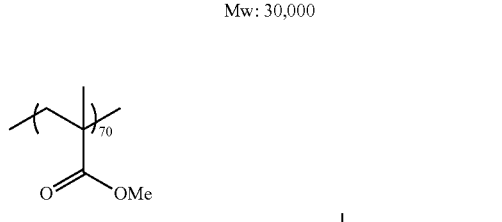
Mw: 28,000
(29)
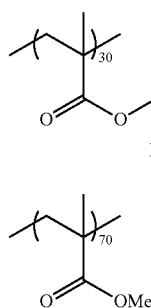

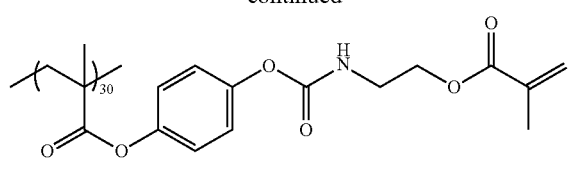
(29)
(30)
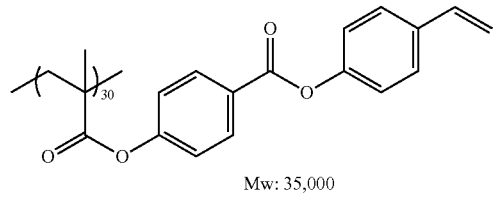
(31)
(32)
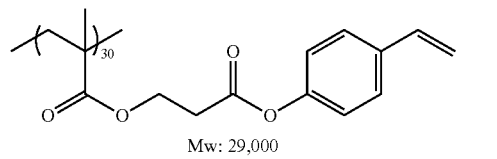
(33)
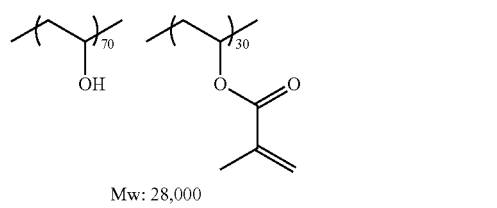
(34)
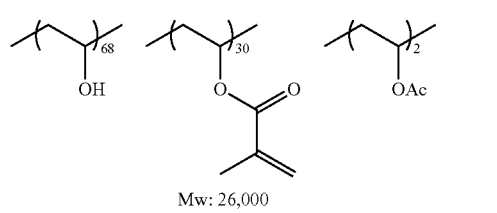
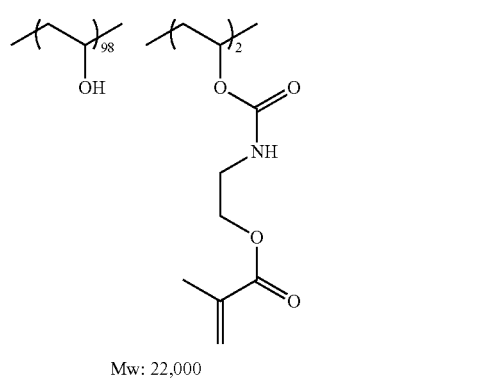
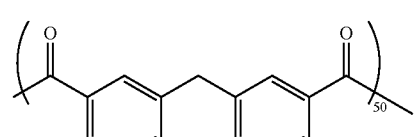
(35)
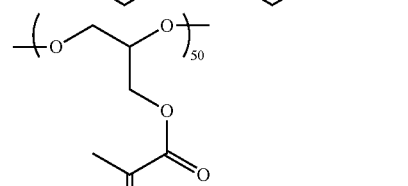
(36)
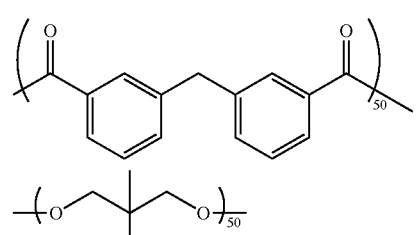
(37)
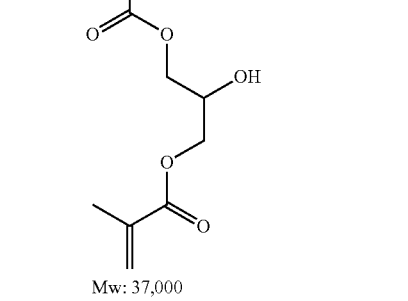
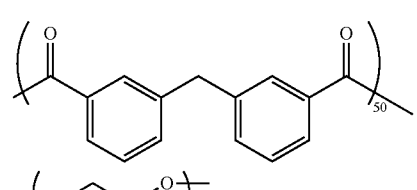
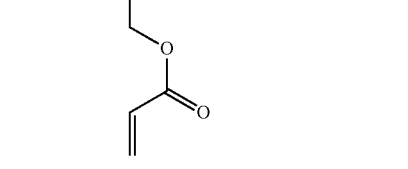
(38)
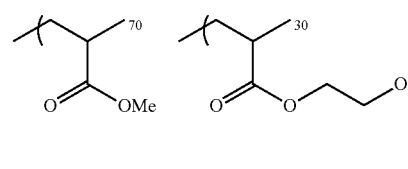

(39)
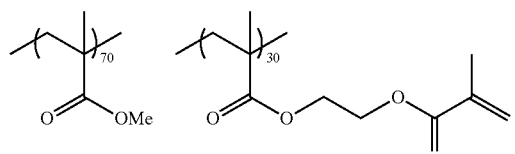
Mw: 450,000
(40)
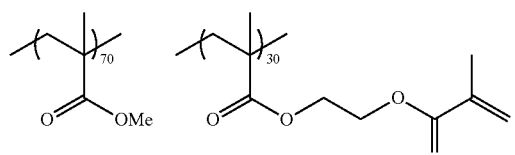
Mw: 1,000,000
(41)
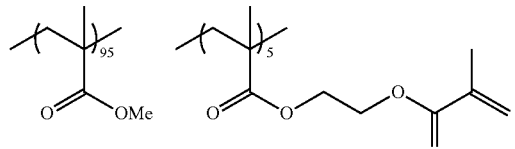
Mw: 45,000
(42)
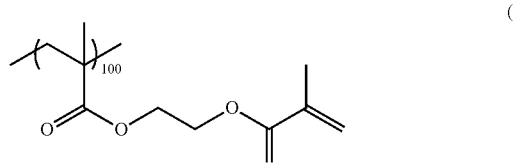
Mw: 32,000
(43)
Mw: 42,000
(44)
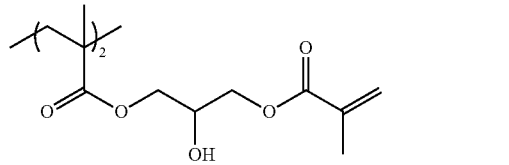
Mw: 83,000
(45)
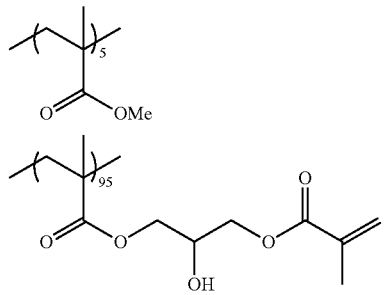
Mw: 10,000
(46)
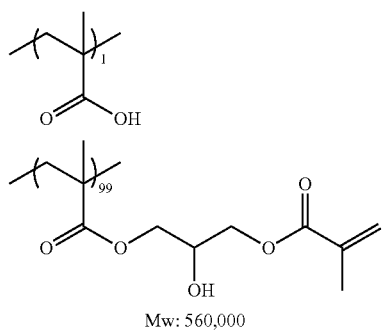
Mw: 560,000
(47)
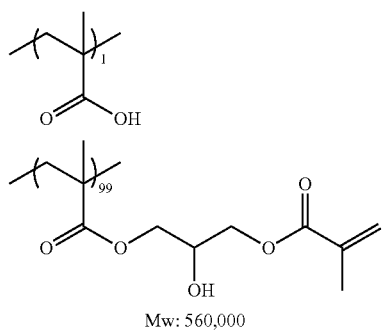
Mw: 48,000
(48)
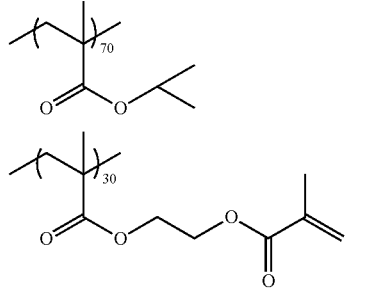
Mw: 12,000
(49)
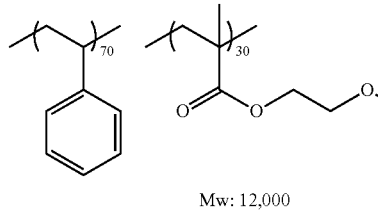
Mw: 10,000
(50)
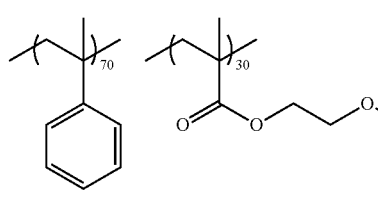

-continued

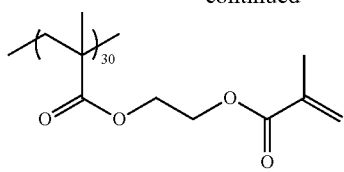

Mw: 500,000

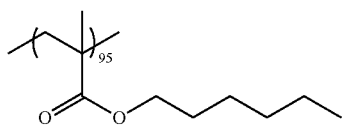

Mw: 45,000

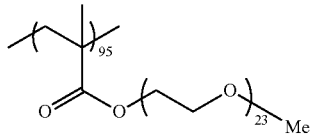

Mw: 82,000

(53)

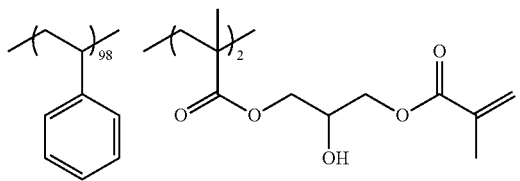

Mw: 12,000

(54)

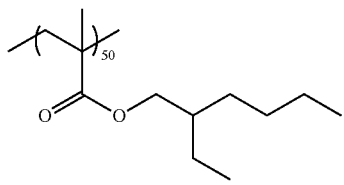

Mw: 83,000

(55)

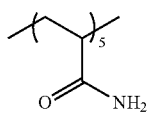

-continued

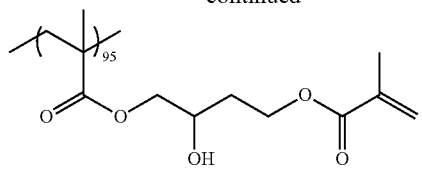

Mw: 21,000

(56)

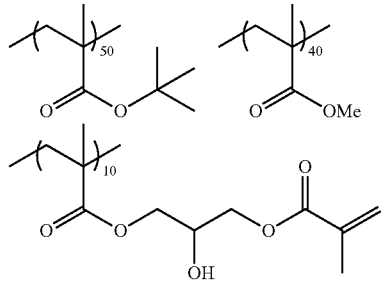

Mw: 35,000

(57)

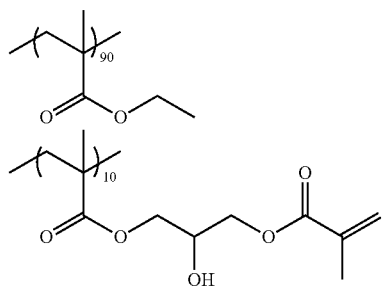

Mw: 48,000

(B) Radical Polymerizable Monomer

The temporary adhesive for production of semiconductor device according to the invention contains a radical polymerizable monomer.

The radical polymerizable monomer typically contains a radical polymerizable group. The radical polymerizable group used herein means a group capable of polymerizing by an action of a radical.

The radical polymerizable monomer is a compound different from the polymer compounds (A) described above. The radical polymerizable monomer is typically a low molecular weight compound, preferably a low molecular weight compound having a molecular weight of 2,000 or less, more preferably a low molecular weight compound having a molecular weight of 1,500 or less, and still more preferably a low molecular weight compound having a molecular weight of 900 or less. The molecular weight of the radical polymerizable monomer is ordinarily 100 or more.

By using the radical polymerizable monomer, when a heat treatment is conducted after adhering the adhesive support to a member to be processed, the polymerization reaction more proceeds by a radical generated from the heat radical polymerization initiator so that the member to be processed can be temporarily supported with a higher adhesive force. On the other hand, for example, when pattern exposure is conducted to the adhesive layer of adhesive support before adhering the adhesive support to a member to be processed as described later, the polymerization reaction of the radical polymerizable monomer proceeds in the exposed area to provide a high adhesive region and a low adhesive region in the adhesive layer.

Also, for example, when active light or radiation, or heat is irradiated to the adhesive layer of adhesive support before adhering the adhesive support to a member to be processed, due to the radical polymerizable monomer the polymerization reaction proceeds to form the adhesive layer in which the adhesion property decreases from the inner surface on the substrate side to the outer surface. Specifically, the adhesion property of the adhesive layer to the member to be processed can be decreased while maintaining high adhesion property between the substrate and the adhesive layer in the adhesive support.

The radical polymerizable monomer is specifically selected from compounds having at least one, preferably two or more radical polymerizable groups. Such compounds are widely known in the field of art and they can be used in the invention without any particular limitation. The compound has a chemical form, for example, a monomer, a prepolymer, specifically, a dimer, a trimer or an oligomer, or a mixture thereof, or a multimer thereof. The radical polymerizable monomers may be used individually or in combination of two or more thereof in the invention.

The radical polymerizable group is preferably an ethylenically unsaturated group. As the ethylenically unsaturated group, a styryl group, a (meth)acryloyl group or an allyl group is preferred.

More specifically, examples of the monomer and prepolymer include an unsaturated carboxylic acid (for example, acrylic acid, methacrylic acid, itaconic acid, crotonic acid, isocrotonic acid or maleic acid) and an ester, amide or multimer thereof. Preferably, an ester of an unsaturated carboxylic acid with a polyhydric alcohol compound, an amide of an unsaturated carboxylic acid with a polyvalent amine compound and a multimer thereof are exemplified. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Further, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferred. As other examples, compounds in which the unsaturated carboxylic acid described above is replaced by an unsaturated phosphonic acid, a vinylbenzene derivative, for example, styrene, vinyl ether, allyl ether or the like may also be used.

With respect to specific examples of the monomer, which is an ester of a polyhydric alcohol compound with an unsaturated carboxylic acid, as an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritol hexaacrylate, pentaerythritol tetraacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO) modified triacrylate and polyester acrylate oligomer are exemplified.

As a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane are exemplified.

As an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate are exemplified.

As a crotonic acid ester, for example, ethylene glycol dicrotonate, tetramethylene glycol dicrotonate, pentaerythritol dicrotonate and sorbitol tetracrotonate are exemplified.

As an isocrotonic acid ester, for example, ethylene glycol diisocrotonate, pentaerythritol diisocrotonate and sorbitol tetraisocrotonate are exemplified.

As a maleic acid ester, for example, ethylene glycol dimaleate, triethylene glycol dimaleate, pentaerythritol dimaleate or sorbitol tetramaleate are exemplified.

As other examples of the ester, aliphatic alcohol esters described in JP-B-46-27926 (the term "JP-B" as used herein means an "examined Japanese patent publication"), JP-B-5147334 and JP-A-57-196231, esters having an aromatic skeleton described in JP-A-59-5240, JP-A-59-5241 and JP-A-2-226149, and esters containing an amino group described in JP-A-1-165613.

Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other preferred examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used.

Also, as the radical polymerizable monomer, compounds described in Paragraph Nos. [0095] to [0108] of JP-A-2009-288705 are preferably used in the invention.

Also, as the radical polymerizable monomer, a compound having an ethylenically unsaturated group which contains at least one addition polymerizable ethylene group and has a boiling point of 100° C. or more under normal pressure is also preferred. Examples thereof include a monofunctional acrylate or methacrylate, for example, polyethylene glycol mono(meth)acrylate, polypropylene glycol mono(meth) acrylate or phenoxyethyl(meth)acrylate; a polyfunctional acrylate or methacrylate, for example, polyethylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol penta(meth)acrylate, dipentaerythritol hexa(meth) acrylate, hexanediol(meth)acrylate, trimethylolpropane tri (acryloyloxypropyl)ether, tri(acryloyloxyethyl) isocyanurate, a compound obtained by adding ethylene oxide or propylene oxide to a polyfunctional alcohol, for example, glycerol or trimethylolethane, followed by (meth) acrylation, an urethane(meth)acrylate as described in JP-B-48-41708, JP-B-50-6034 and JP-A-51-37193, a polyester acrylate described in JP-A-48-64183, JP-B-49-43191 and JP-B-52-30490, and an epoxy acrylate as a reaction product of an epoxy resin and (meth)acrylic acid; and a mixture thereof.

A polyfunctional (meth)acrylate obtained by reacting a polyfunctional carboxylic acid with a compound having a cyclic ether group and an ethylenically unsaturated group, for example, glycidyl(meth)acrylate is also exemplified.

Also, as other preferred radical polymerizable monomers, compounds having a fluorene ring and two or more ethylenic polymerizable groups described, for example, in JP-A-2010-160418, JP-A-2010-129825 and Japanese Patent No. 4,364,216, and a cardo resin may also be used.

Further, as other examples of the radical polymerizable monomer, specific unsaturated compounds described in JP-B-46-43946, JP-B-1-40337 and JP-B-1-40336, and vinylphosphonic acid compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyo-kaishi* (*Journal of Japan Adhesion Society*), Vol. 20, No. 7, pages 300 to 308 (1984) can also be used.

As the compound having an ethylenically unsaturated group which contains at least one addition polymerizable ethylene group and has a boiling point of 100° C. or more under normal pressure, compounds described in Paragraph Nos. [0254] to [0257] of JP-A-2008-292970 are also preferred.

In addition, radical polymerizable monomers represented by formulae (MO-1) to (MO-5) shown below can also be peferably used. In the formulae, when T is an oxyalkylene group, the oxyalkylene group is connected to R at its terminal on the carbon atom side.

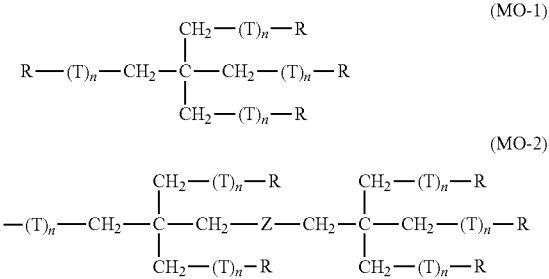

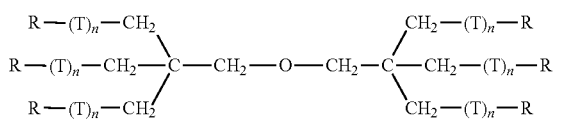

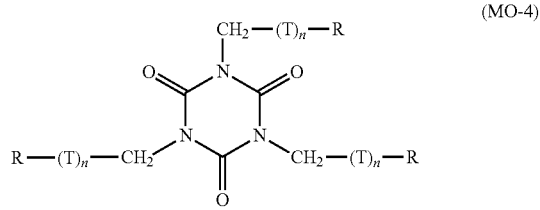

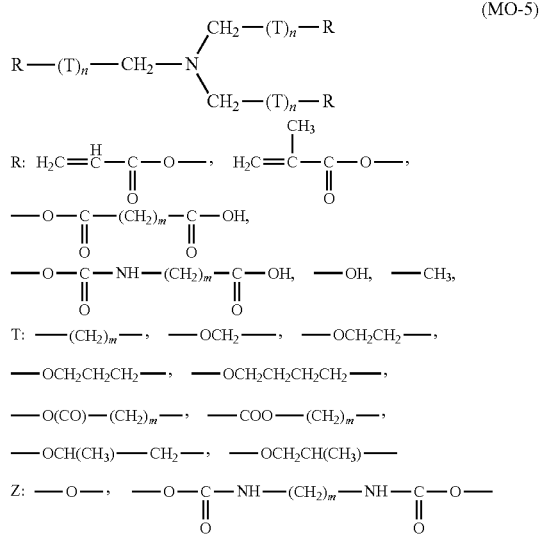

In the formulae above, n is from 0 to 14 and m is from 1 to 8. When plural Rs or plural Ts are present in one molecule, plural Rs or plural Ts may be the same or different from each other.

In each of the radical polymerizable monomers represented by formulae (MO-1) to (MO-5), at least one of plural Rs represents a group represented by —OC(=O)CH=CH$_2$ or —OC(=O)C(CH$_3$)=CH$_2$.

As to specific examples of the radical polymerizable monomers represented by formulae (MO-1) to (MO-5), compounds described in Paragraph Nos. [0248] to [0251] of JP-A-2007-269779 may also be preferably used in the invention.

The compound obtained by adding ethylene oxide or propylene oxide to a polyfunctional alcohol, followed by (meth)acrylation described above, represented by formulae (1) and (2) described together with their specific examples in JP-A-10-62986 can also be used as the radical polymerizable monomer.

Among them, dipentaerythritol triacrylate (as a commercially available product, KAYARAD D-330, produced by Nippon Kayaku Co., Ltd.), dipentaerythritol tetraacrylate (as a commercially available product, KAYARAD D-320, produced by Nippon Kayaku Co., Ltd.), dipentaerythritol penta (meth)acrylate (as a commercially available product, KAYARAD D-310, produced by Nippon Kayaku Co., Ltd.), dipentaerythritol hexa(meth)acrylate (as a commercially available product, KAYARAD DPHA, produced by Nippon Kayaku Co., Ltd.), and structures where the (meth)acryloyl group of the compounds described above are connected through an ethylene glycol or propylene glycol residue are preferred as the radical polymerizable monomer. Oligomer types of these compounds can also be used.

The radical polymerizable monomer may be a polyfunctional monomer having an acid group, for example, a carboxyl group, sulfonic acid group or phosphoric acid group. Therefore, when the ethylenic compound has an unreacted carboxyl group as in the case of the mixture described above, it may be utilized as it is but, if desired, a non-aromatic carboxylic anhydride may be reacted with a hydroxy group of the ethylenic compound to introduce an acid group. In this case, specific examples of the non-aromatic carboxylic anhydride include tetrahydrophthalic anhydride, an alkylated tetrahydrophthalic anhydride, hexahydrophthalic anhydride, an alkylated hexahydrophthalic anhydride, succinic anhydride and maleic anhydride.

In the invention, the acid group-containing monomer is preferably a polyfunctional monomer which is an ester of an aliphatic polyhydroxy compound and an unsaturated carboxylic acid and obtained by reacting a non-aromatic carboxylic anhydride with an unreacted hydroxyl group of the aliphatic polyhydroxy compound to introduce the acid group, and particularly preferably the ester described above where the aliphatic polyhydroxy compound is pentaerythritol and/or dipentaerythritol. The commercially available product thereof includes, for example, polybasic acid-modified acryl oligomers M-510 and M-520 produced by Toagosei Co., Ltd.

The monomers may be used individually, but since it is difficult to use a single compound in view of production, two or more monomers may be used as a mixture. Also, as the monomer, a polyfunctional monomer having no acid group and a polyfunctional monomer having an acid group may be used in combination, if desired.

The acid value of the polyfunctional monomer having an acid group is preferably from 0.1 to 40 mg-KOH/g, and particularly preferably from 5 to 30 mg-KOH/g. When the acid value of the polyfunctional monomer is too low, the development dissolution characteristic decreases, whereas when the acid value of the polyfunctional monomer is too high, the production or handling thereof becomes difficult, the photopolymerization performance decreases and the curing property, for example, surface smoothness of pixel deteriorates. Therefore, in the case where two or more polyfunctional monomers having different acid groups are used in combination or in the case where a polyfunctional monomer having no acid group is used in combination, it is essential to adjust the acid value as the total polyfunctional monomer falls within the range described above.

Also, it is preferred to contain a polyfunctional monomer having a caprolactone structure as the radical polymerizable monomer.

The polyfunctional monomer having a caprolactone structure is not particularly limited as long as it has a caprolactone structure in the molecule thereof, and includes, for example, an ε-caprolactone-modified polyfunctional (meth)acrylate obtained by esterification of a polyhydric alcohol, for example, trimethylolethane, ditrimethylolethane, trimethylolpropane, ditrimethylolpropane, pentaerythritol, dipentaerythritol, tripentaerythritol, glycerol, diglycerol or trimethylolmelamine with (meth)acrylic acid and E-caprolactone. Among them, a polyfunctional monomer having a caprolactone structure represented by formula (1) shown below is preferred.

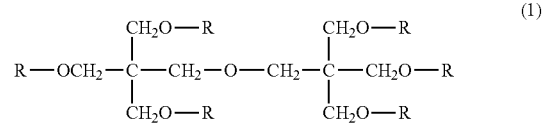

In formula (1), all of six Rs are groups represented by formula (2) shown below, or one to five of six Rs are groups represented by formula (2) shown below and the remainder is a group represented by formula (3) shown below.

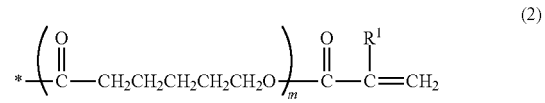

In formula (2), $R^1$ represents a hydrogen atom or a methyl group, m represents a number of 1 or 2, and * represents a connecting site.

In formula (3), $R^1$ represents a hydrogen atom or a methyl group and * represents a connecting site.

The polyfunctional monomer having a caprolactone structure is commercially available as KAYARAD DPCA Series from Nippon Kayaku Co., Ltd. and includes DPCA-20 (compound represented by formulae (1) to (3), wherein m is 1, a number of the groups represented by formula (2) is 2, and all of $R^1$ are hydrogen atoms), DPCA-30 (compound represented by formulae (1) to (3), wherein m is 1, a number of the groups represented by formula (2) is 3, and all of $R^1$ are hydrogen atoms), DPCA-60 (compound represented by formulae (1) to (3), wherein m is 1, a number of the groups represented by formula (2) is 6, and all of $R^1$ are hydrogen atoms) and DPCA-120 (compound represented by formulae (1) to (3), wherein m is 2, a number of the groups represented by formula (2) is 6, and all of $R^1$ are hydrogen atoms).

The polyfunctional monomers having a caprolactone structure may be used individually or as a mixture of two or more thereof in the invention.

It is also preferred that the polyfunctional monomer is at least one compound selected from the group consisting of compounds represented by formulae (i) and (ii) shown below.

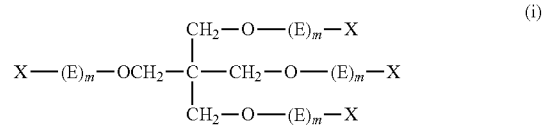

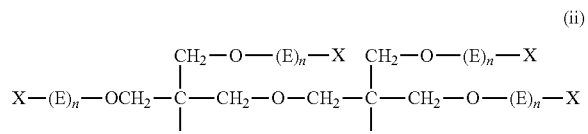

In formulae (i) and (ii), E each independently represents $-((CH_2)_yCH_2O)-$ or $-((CH_2)_yCH(CH_3)O)-$, y each independently represents an integer from 0 to 10, and X each independently represents an acryloyl group, a methacryloyl group, a hydrogen atom or a carboxyl group.

In formula (i), the total number of acryloyl groups and methacryloyl groups is 3 or 4, m each independently represents an integer from 0 to 10, and the total of each m is an integer from 0 to 40, provided that when the total of each m is 0, any one of Xs is a carboxyl group.

In formula (ii), the total number of acryloyl groups and methacryloyl group is 5 or 6, n each independently represents an integer from 0 to 10, and the total of each n is an integer from 0 to 60, provided that when the total of each n is 0, any one of Xs is a carboxyl group.

In formula (i), m is preferably an integer from 0 to 6, and more preferably an integer from 0 to 4.

The total of each m is preferably an integer from 2 to 40, more preferably an integer from 2 to 16, and particularly preferably an integer from 4 to 8.

In formula (ii), n is preferably an integer from 0 to 6, and more preferably an integer from 0 to 4.

The total of each n is preferably an integer from 3 to 60, more preferably an integer from 3 to 24, and particularly preferably an integer from 6 to 12.

In a preferred embodiment, —(($CH_2$)$_y$$CH_2$O)— or —(($CH_2$)$_y$CH($CH_3$)O)— in formula (i) or (ii) is connected to X at its terminal on the oxygen atom side.

The compounds represented by formulae (i) and (ii) may be used individually or in combination of two or more thereof. In particular, an embodiment where all of six Xs in formula (ii) are acryloyl groups is preferred.

The total content of the compound represented by formula (i) or (ii) in the radical polymerizable monomer is preferably 20% by weight or more, and more preferably 50% by weight or more.

The compound represented by formula (i) or (ii) can be synthesized through a process of connecting a ring-opened skeleton of ethylene oxide or propylene oxide to pentaerythritol or dipentaerythritol by a ring-opening addition reaction, and a process of introducing a (meth)acryloyl group into the terminal hydroxyl group of the ring-opened skeleton by reacting, for example, (meth)acryloyl chloride, which are conventionally known processes. Each of the processes is a well-known process, and the compound represented by formula (i) or (ii) can be easily synthesized by a person skilled in the art.

Of the compounds represented by formulae (i) and (ii), a pentaerythritol derivative and/or a dipentaerythritol derivative are more preferred.

Specific examples of the compounds include compounds represented by formulae (a) to (f) shown below (hereinafter, also referred to as Compounds (a) to (f) sometimes), and among them Compounds (a), (b), (e) and (f) are preferred.

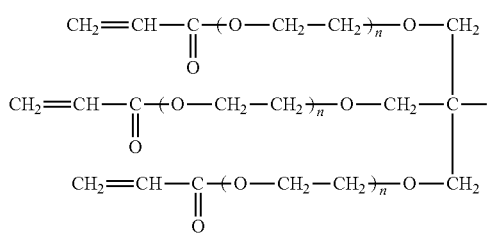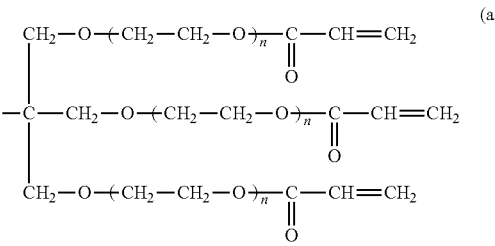

(a)

(total of each n is 6)

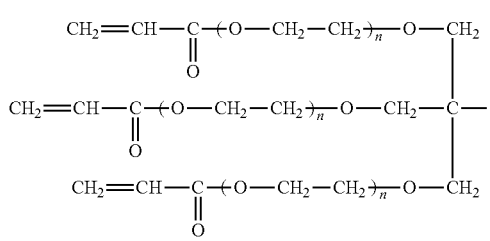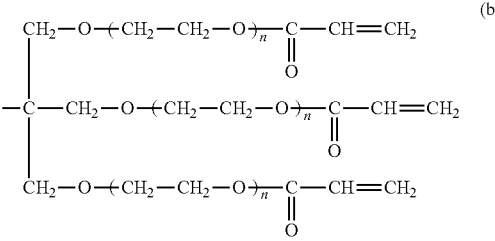

(b)

(total of each n is 12)

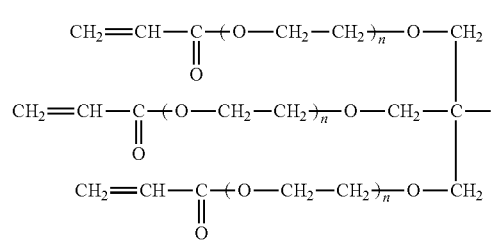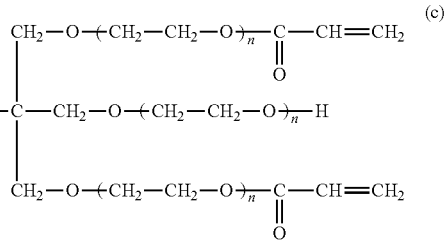

(c)

(total of each n is 12)

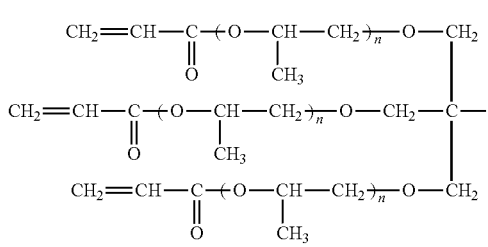

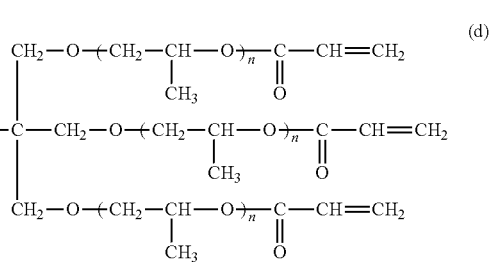
(d)

(total of each n is 6)

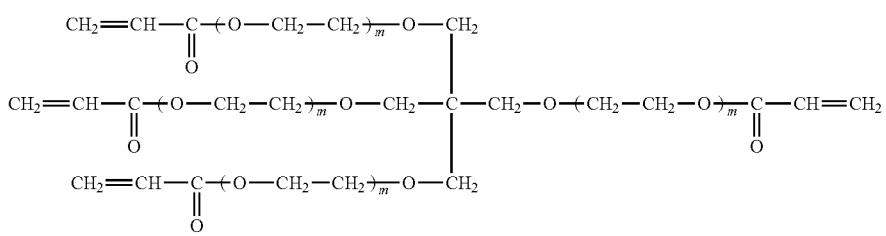
(e)

(total of each m is 4)

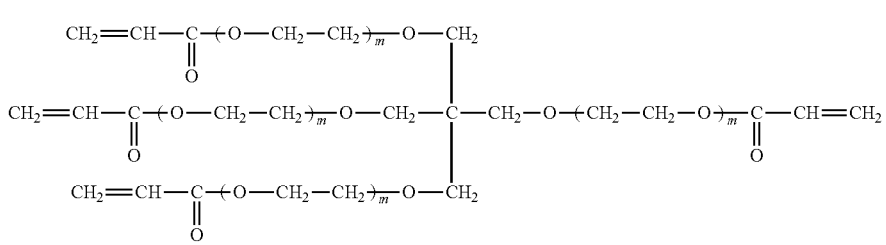
(f)

(total of each m is 12)

As a commercially available product of the radical polymerizable monomer represented by formula (i) or (ii), for example, SR-494 which is a tetrafunctional acrylate having four ethyleneoxy chains, produced by Sartomer Co., and DPCA-60 which is a hexafunctional acrylate having six pentyleneoxy chains and TPA-330 which is a bifunctional acrylate having three isobutyleneoxy chains, produced by Nippon Kayaku Co., Ltd. are exemplified.

Further, urethane acrylates as described in JP-B-48-41708, JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are also preferred as the radical polymerizable monomer. In addition, addition polymerizable compounds having an amino structure or a sulfide structure in the molecules thereof described in JP-A-63-277653, JP-A-63-260909 and JP-A-1-105238 are also used as the radical polymerizable monomer.

As a commercially available product of the radical polymerizable monomer, for example, Urethane Oligomer UAS-10 and UAB-140 (produced by Sanyo-Kokusaku Pulp Co., Ltd.), UA-7200 (produced by Shin-Nakamura Chemical Co., Ltd.), DPHA-40H (produced by Nippon Kayaku Co., Ltd.), UA-306H, UA-306T, UA-306I, AH-600, T-600 and AI-600 (produced by Kyoeisha Chemical Co., Ltd.), UA-1100H (produced by Shin-Nakamura Chemical Co., Ltd.), A-TMPT (produced by Shin-Nakamura Chemical Co., Ltd.) and A-DPH (produced by Shin-Nakamura Chemical Co., Ltd.) are exemplified.

A polyfunctional thiol compound having two or more mercapto (SH) groups in its molecule is also preferably used as the radical polymerizable monomer. In particular, compounds represented by formulae (I) shown below are preferred.

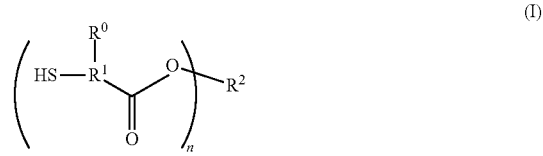
(I)

In formula (I), R' represents an alkylene group, $R^2$ represents an n-valent aliphatic group which may contain an atom(s) other than carbon atom, $R^0$ represents an alkyl group exclusive of a hydrogen atom, and n represents an integer from 2 to 4.

Specific examples of the polyfunctional thiol compound represented by formula (I) include 1,4-bis(3-mercaptobutyryloxy)butane (represented by formula (II)), 1,3,5-tris(3-mercaptobutyloxyemyl)-1,3,5-triazine-2,4,6(1H,3H,5H)trione (represented by formula (III)) and pentaerythritol tetrakis(3-mercaptobutylate) (represented by formula (IV)). The polyfunctional thiol compounds may be used individually or in combination of two or more thereof.

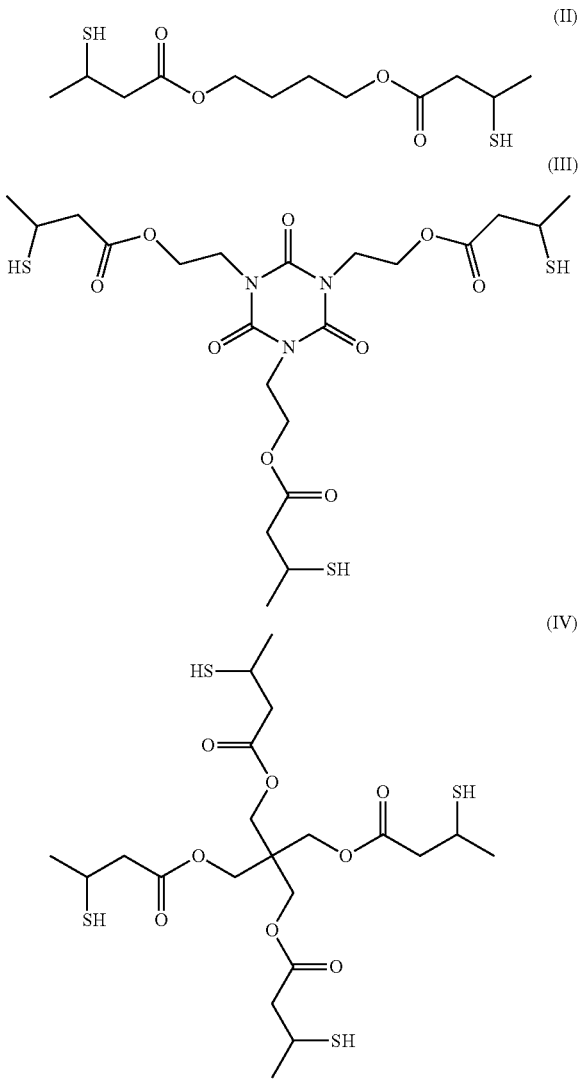

The amount of the polyfunctional thiol compound added to the temporary adhesive is preferably in a range from 0.3 to 8.9% by weight, more preferably in a range from 0.8 to 6.4% by weight, based on the total solid content exclusive of solvent of the temporary adhesive. By the addition of polyfunctional thiol compound, stability, odor, sensitivity, adhesion property and the like of the temporary adhesive can be improved.

Details of the method of using the radical polymerizable monomer, for example, selection of the structure, individual or combination use, or an amount added, can be appropriately set depending on the final characteristic design of the temporary adhesive. For instance, from the standpoint of the sensitivity (efficiency of decrease in the adhesion property by the irradiation of active light or radiation), a structure having a large content of unsaturated groups per molecule is preferred, and in many cases, a difunctional or more functional compound is preferred. In order to increase the strength of adhesive layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength. Further, a combination use of the radical polymerizable monomers of trifunctional or more functional compounds different in the length of ethylene oxide chain is also preferred. The selection and use method of the radical polymerizable monomer are also important factors for the compatibility and dispersibility with other components (for example, the polymer compound (A) or a polymerization initiator) contained in the temporary adhesive. For instance, the compatibility may be improved in some cases by using the radical polymerizable monomer of low purity or using two or more kinds of the radical polymerizable monomers in combination. A specific structure may be selected for the purpose of improving the adhesion property to a carrier substrate.

The content of the radical polymerizable monomer (B) is preferably from 5 to 75% by weight, more preferably from 10 to 70% by weight, still more preferably from 10 to 60% by weight, based on the total solid content of the temporary adhesive for production of semiconductor device from the standpoint of good adhesion strength and good releasing property.

Also, a ratio (weight ratio) of contents of the radical polymerizable monomer (B) and the polymer compound (A) is preferably from 90/10 to 10/90, and more preferably from 20/80 to 80/20.

(C) Heat Radical Polymerization Initiator

The temporary adhesive for production of semiconductor device according to the invention may further contain a heat radical polymerization initiator.

The heat radical polymerization initiator is a compound which generates a radical with heat energy to initiate or accelerate the polymerization reaction of the polymer compound having a polymerizable group and the polymerizable monomer. By the addition of the heat radical polymerization initiator, when a heat treatment is conducted to the adhesive layer of the adhesive support after performing the temporary adhesion between the member to be processed and the adhesive support, the polymerization reaction of the polymer compound (A) and the radical polymerizable monomer (B) more proceeds by a radical generated from the heat radical polymerization initiator so that the member to be processed can be temporarily supported with a high adhesive force. This is supposed that an anchor effect at the interface between the adhesive support and the member to be processed is accelerated due to the heat treatment conducted after the temporary adhesion of the adhesive support to the member to be processed.

Hence, in the system of using the radical polymerizable monomer together with the heat radical polymerization initiator according to the invention, the curing rate of the radical polymerizable monomer with heat is high in comparison with, for example, a system using an acid polymerizable monomer and a heat acid generating agent, and the high adhesive force can be developed even under practically preferred heating conditions (for example, heating temperature of 180° C. and heating time of 60 seconds).

Also, in the case where the temporary adhesion between the member to be processed and the adhesive support is performed after conducting irradiation of heat to the adhesive layer formed by using the temporary adhesive, the polymerization reaction of the polymer compound (A) and the radical polymerizable monomer (B) proceeds by the heat so that the adhesion property (that is, adherence property and tacking property) of the adhesive layer can be previously reduced as described in detail below.

The heat radical polymerization initiator preferably has a thermal decomposition temperature from 130 to 250° C., and more preferably from 150 to 220° C.

Examples of the heat radical polymerization initiator include an aromatic ketone, an onium salt compound, an organic peroxide, a thio compound, a hexaarylbiimidazole compound, a ketoxime ester compound, a borate compound, an azinium compound, a metallocene compound, an active ester compound, a compound containing a carbon-halogen bond and an azo compound. Also, compounds corresponding to the photo-radical polymerization initiator described below are exemplified. Among them, a nonionic radical polymerization initiator, for example, an aromatic ketone, an organic peroxide, a thio compound, a hexaarylbiimidazole compound, a ketoxime ester compound, an active ester compound, a compound containing a carbon-halogen bond or an azo compound is preferred, and from the standpoint of the thermal decomposition temperature from 130 to 250° C., an aromatic ketone (more specifically a thioxanthone), a ketoxime ester compound, an organic peroxide or an azo compound is more preferred, and an organic peroxide is particularly preferred.

Specifically, compounds described in Paragraph Nos. [0074 to 0118] of JP-A-2008-63554 are exemplified. As a commercially available product, for example, PEROYL IB, PERCUMYL ND, PEROYL NPP, PEROYL IPP, PEROYL SBP, PEROCTA ND, PEROYL TCP, PERROYL OPP, PER-HEXYL ND, PERBUTYL ND, PERBUTYL NHP, PERHEXYL PV, PERBUTYL PV, PEROYL 355, PEROYL L, PEROCTA O, PEROYL SA, PERHEXA 250, PERHEXYL O, NYPER PMB, PERBUTYL O, NYPER BMT, NYPER BW, PERHEXA MC, PERHEXA TMH, PERHEXA HC, PERTETRA A, PERHEXYL I, PERBUTYL MA, PERBUTYL 355, PERBUTYL L, PERBUTYL I, PERBUTYL E, PERHEXYL Z, PERHEXA 25Z, PERBUTYL A, PERHEXA 22, PERBUTYL Z, PERHEXA V, PERBUTYL R, PERCUMYL D, PERHEXYL D, PERHEXA 25B, PERBUTYL C, PERBUTYL D, RERMENTHA H, PERHEXYN 25B, PERCUMYL P, PEROCTA H, PERCUMYL H and PERBUTYL H (produced by NOF Corp.) are exemplified.

The heat radical polymerization initiator for use in the invention may be used in a combination of two or more thereof, if desired.

The content (total content in the case of using two or more kinds) of the heat radical polymerization initiator in the temporary adhesive for production of semiconductor device according to the invention is preferably from 0.01 to 50% by weight, more preferably from 0.1 to 20% by weight, most preferably from 0.5 to 10% by weight, based on the total solid content of the temporary adhesive, from the standpoint of reducing the adhesion property of the adhesive layer in the case of conducting the irradiation of heat before performing the temporary adhesion of the member to be processed and the adhesive support and increasing the adhesion property of the adhesive layer in the case of conducting the irradiation of heat after performing the temporary adhesion of the member to be processed and the adhesive support.

(D) Photo-radical Polymerization Initiator

The temporary adhesive for production of semiconductor device according to the invention preferably further contain a photo-radical polymerization initiator, that is, a compound which generates a radical upon irradiation of active light or radiation. By the addition of the photo-radical polymerization initiator, for example, when pattern exposure is conducted to the adhesive layer of the adhesive support before adhering the adhesive support to a member to be processed as described later, the polymerization reaction proceeds in the exposed area to provide a high adhesive region and a low adhesive region in the adhesive layer.

As the compound which generates a radical upon irradiation of active light or radiation, for example, compounds known as polymerization initiators described below can be used.

The photo-radical polymerization initiator is not particularly limited as long as it has an ability to initiate a polymerization reaction (crosslinking reaction) of a polymerizable group of the polymer compound (A) or a polymerizable group of the polymerizable monomer (B), and can be appropriately selected from known polymerization initiators. For example, a polymerization initiator having photosensitivity to light from an ultraviolet ray region to a visible region is preferred. Also, the polymerization initiator may be an activator which causes any action with a photo-excited sensitizer to produce an active radical.

Further, it is preferred that the photo-radical polymerization initiator contains at least one compound having a molecular absorption coefficient of at least about 50 within the range from about 300 to 800 nm (preferably from 330 to 500 nm).

As the photo-radical polymerization initiator, known compounds are used without limitation. The photo-radical polymerization initiator includes, for example, a halogenated hydrocarbon derivative (for example, a compound having a triazine skeleton, a compound having an oxadiazole skeleton or a compound having a trihalomethyl group), an acylphosphine compound, for example, an acylphosphine oxide, a hexaarylbiimidazole, an oxime compound, for example, an oxime derivative, an organic peroxide, a thio compound, a ketone compound, an aromatic onium salt, a ketoxime ether, an aminoacetophenone compound, a hydroxyacetophenone, an azo compound, an azide compound, a metallocene compound, an organic boron compound, and an iron arene complex. As the photo-radical polymerization initiator, a nonionic photo-radical polymerization initiator is preferred, and, for example, a halogenated hydrocarbon derivative (for example, a compound having a triazine skeleton, a compound having an oxadiazole skeleton or a compound having a trihalomethyl group), an acylphosphine compound, for example, an acylphosphine oxide, a hexaarylbiimidazole, an oxime compound, for example, an oxime derivative, an organic peroxide, a thio compound, a ketone compound, a ketoxime ether, an aminoacetophenone compound, a hydroxyacetophenone and an azo compound are exemplified.

The halogenated hydrocarbon compound having a triazine skeleton includes, for example, compounds described in Wakabayashi et al., *Bull. Chem. Soc. Japan,* 42, 2924 (1969), compounds described in British Patent 1,388,492, compounds described in JP-A-53-133428, compounds described in German Patent 3,337,024, compounds described in F. C. Schaefer et al., *J. Org. Chem.,* 29, 1527 (1964), compounds described in JP-A-62-58241, compounds described in JP-A-5-281728, compounds described in JP-A-5-34920, and compounds described in U.S. Pat. No. 4,212,976.

The compounds described in U.S. Pat. No. 4,212,976 include, for example, a compound having an oxadiazole skeleton (for example, 2-trichloromethyl-5-phenyl-1,3,4- oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole or 2-tribromomethyl-5-styryl-1,3,4-oxadiazole).

Also, examples of the polymerization initiator other than the polymerization initiators described above include an acridine derivative (for example, 9-phenylacridine or 1,7-bis(9,9'-acridinyl)heptane), N-phenylglycine, a polyhalogen compound (for example, carbon tetrabromide, phenyl tribromomethyl sulfone or phenyl trichloromethyl ketone), a coumarin (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described, for example, in JP-A-5-19475, JP-A-7-271028, JP-A-2002-363206, JP-A-2002-363207, JP-A-2002-363208 and JP-A-2002-363209), an acylphosphine oxide (for example, bis(2,4,6-trimethylbenzoyl)phenylphosphine oxide, bis(2,6-dimethoxybenzoyl)-2,4,4-trimethylpentylphenylphosphine oxide or LUCIRIN TPO), a metallocene (for example, bis(η5-2,4-cyclopentadien-1-yl)-bis(2,6-difluoro-3-(1H-pyrrol-1-yl)phenyl)titanium or η5-cyclopentadienyl-η6-cumenyl-iron(1+)-hexafluorophosphate(1−)), compounds described in JP-A-53-133428, JP-B-57-1819, JP-B-57-6096 and U.S. Pat. No. 3,615,455.

The ketone compound includes, for example, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or tetramethyl ester thereof, a 4,4'-bis(dialkylamino)benzophenone (for example, 4,4'-bis(dimethylamino)benzophenone, 4,4'-bis(dicyclohexylamino)benzophenone, 4,4'-bis(diethylamino)benzophenone or 4,4'-bis(dihydroxyethylamino)benzophenone), 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, phenanthraquinone, xanthone, thioxanthone, 2-chlorothioxanthone, 2,4-diethylthioxanthone, fluorenone, 2-benzyldimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, a benzoin ether (for example, benzoin methyl ether, benzoin ethyl ether, benzoin propyl ether, benzoin isopropyl ether, benzoin phenyl ether or benzyl dimethyl ketal), acridone, chloroacridone, N-methylacridone, N-butylacridone and N-butylchloroacridone.

As the photo-radical polymerization initiator, a hydroxyacetophenone compound, an aminoacetophenone compound and an acylphosphine compound can also be preferably used. More specifically, for example, an aminoacetophenone initiator described in JP-A-10-291969 and an acylphosphine oxide initiator described in Japanese Patent No. 4225898 can also be used.

As the hydroxyacetophenone initiator, IRGACURE 184, DAROCUR 1173, IRGACURE 500, IRGACURE 2959 and IRGACURE 127 (trade names, produced by BASF Corp.) can be used. As the aminoacetophenone initiator, commercially available products of IRGACURE 907, IRGACURE 369 and IRGACURE 379 (trade names, produced by BASF Corp.) can be used. As the aminoacetophenone initiator, compounds described in JP-A-2009-191179, where the absorption wavelength matches the light source having a long wavelength, for example, 365 nm or 405 nm, can also be used. Also, as the acylphosphine initiator, commercially available products of IRGACURE 819 and DAROCUR TPO (trade names, produced by BASF Corp.) can be used.

The photo-radical polymerization initiator more preferably includes an oxime compound. As specific examples of the oxime initiator, compounds described in JP-A-2001-233842, compounds describe in JP-A-2000-80068 and compounds described in JP-A-2006-342166 can be used.

Examples of the oxime compound, for example, an oxime derivative, which is preferably used as the photo-radical polymerization initiator include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one and 2-ethoxycarbonyloxyimino-1-phenylpropan-1-one.

The oxime ester compound includes, for example, compounds described in *J. C. S. Perkin II*, (1979) pp. 1653-1660, *J. C. S. Perkin II*, (1979) pp. 156-162, *Journal of Photopolymer Science and Technology*, (1995) pp 202-232, JP-A-2000-66385, JP-A-2000-80068, JP-T-2004-534797 and JP-A-2006-342166.

As the commercially available product, IRGACURE OXE 01 (produced by BASF Corp.) and IRGACURE OXE 02 (produced by BASF Corp.) are also preferably used.

In addition, as the oxime ester compound other than the oxime ester compounds described above, compounds described in JP-T-2009-519904, wherein oxime is connected to the N-position of carbazole, compounds described in U.S. Pat. No. 7,626,957, wherein a hetero-substituent is introduced into the benzophenone moiety, compounds described in JP-A-2010-15025 and U.S. Patent Publication No. 2009/0292039, wherein a nitro group is introduced into the dye moiety, ketoxime compounds described in WO 2009/131189, compounds containing a triazine skeleton and an oxime skeleton in the same molecule described in U.S. Pat. No. 7,556,910, and compounds having an absorption maximum at 405 nm and exhibiting good sensitivity for a g-line light source described in JP-A-2009-221114 may also be used.

Furthermore, cyclic oxime compounds described in JP-A-2007-231000 and JP-A-2007-322744 can also be preferably used. Of the cyclic oxime compounds, cyclic oxime compounds condensed to a carbazole dye described in JP-A-2010-32985 and JP-A-2010-185072 have high light absorptivity and thus are preferred from the standpoint of high sensitivity.

Further, compounds described in JP-A-2009-242469 having an unsaturated bond at a specific site of an oxime compound can achieve high sensitivity by regenerating an active radical from a polymerization inactive radical, and thus are preferably used.

Oxime compounds having a specific substituent described in JP-A-2007-269779 and oxime compounds having a thioaryl group described in JP-A-2009-191061 are most preferred.

From the standpoint of exposure sensitivity, the photo-radical polymerization initiator is preferably a compound selected from the group consisting of a trihalomethyltriazine compound, a benzyl dimethyl ketal compound, an α-hydroxyketone compound, an α-aminoketone compound, an acylphosphine compound, a phosphine oxide compound, a metallocene compound, an oxime compound, a triallylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound and a 3-aryl-substituted coumarin compound.

A trihalomethyltriazine compound, an a-aminoketone compound, an acylphosphine compound, a phosphine oxide compound, an oxime compound, a triallylimidazole dimer, an onium compound, a benzophenone compound or an acetophenone compound is more preferred, and at least one compound selected from the group consisting of a trihalomethyltriazine compound, an a-aminoketone compound, an oxime compound, a triallylimidazole dimer and a benzophenone compound is most preferred. It is most preferred to use an oxime compound.

The photo-radical polymerization initiators used in the invention may be used two or more thereof in combination, if desired.

The content (total content in the case of using two or more kinds) of the photo-radical polymerization initiator is preferably from 0.1 to 50% by weight, more preferably from 0.1 to 30% by weight, still more preferably 0.1 to 20% by weight, based on the total solid content of the temporary adhesive.

<Other Components>

The temporary adhesive according to the invention may further contain various compounds different from Components (A) to (D) described above depending on the purpose, as long as the effects of the invention are not impaired.

(E) Polymer Compounds not Having a Radical Polymerizable Group

To the temporary adhesive for production of semiconductor device according to the invention may added a different polymer compound (E) in order to improve both the releasing property and the adhesion property with a good balance. As such a polymer compound, a (meth)acrylic polymer, a polyurethane resin, a polyvinyl alcohol resin, a polyvinyl acetal resin (preferably, a polyvinyl butyral resin), a polyvinyl formal resin, a polyamide resin, a polyester resin, an epoxy resin and a novolac resin are used.

The "(meth)acrylic polymer" as used in the invention means a copolymer containing as a polymerization component, (meth)acrylic acid or a (meth)acrylic acid derivative, for example, a (meth)acrylic acid ester (including, for example, an alkyl ester, an aryl ester and an allyl ester), (meth)acrylamide or a (meth)acrylamide derivative.

The term "polyurethane resin" as used herein means a polymer produced by a condensation reaction of a compound having two or more isocyanate groups and a compound having two or more hydroxy groups.

The term "polyvinyl butyral resin" as used herein means a polymer synthesized by a reaction (acetalization reaction) of polyvinyl alcohol obtained by partial or full saponification of polyvinyl acetate with butylaldehyde under an acidic condition. Further, it also includes a polymer wherein an acid group or the like is introduced by a method of reacting the remaining hydroxy group of polymer with a compound having the acid group or the like.

The "novolac resin" as used herein means a polymer produced by a condensation reaction of a phenol (for example, phenol or cresol) with an aldehyde (for example, formaldehyde). Further, it also includes a polymer in which a substituent is introduced, for example, by a method of reacting a different compound with the remaining hydroxy group.

As preferred examples of the novolac resin, a novolac resin, for example, a phenol formaldehyde resin, a m-cresol formaldehyde resin, a p-cresol formaldehyde resin, a m-/p-mixed cresol formaldehyde resin or a phenol/cresol (may be any of m-, p-, and m-/p-mixed) mixed formaldehyde resin is exemplified. A novolac resin having a weight average molecular weight from 500 to 20,000 and a number average molecular weight from 200 to 10,000 is preferred. Also, a compound in which a substituent is introduced by reacting a different compound with a hydroxy group of the novolac resin can be preferably used.

The weight average molecular weight of the polymer compound (E) is preferably 5,000 or more, more preferably from 10,000 to 300,000, and the number average molecular weight thereof is preferably 1,000 or more, more preferably from 2,000 to 250,000. The polydispersity (weight average molecular weight/number average molecular weight) is preferably from 1.1 to 10.

The polymer compounds (E) may be used individually or in combination of two or more thereof.

The content of the polymer compound (E) is preferably from 5 to 95% by weight, more preferably from 10 to 90% by weight, still more preferably from 20 to 80% by weight, based on the total solid content of the temporary adhesive from the standpoint of good adhesion strength.

(F) Sensitizing Dye

The temporary adhesive according to the invention may contain a sensitizing dye (F).

The sensitizing dye for use in the invention is not particularly limited as long as it absorbs light at the exposure to form the excited state and provides energy to the polymerization initiator described above with electron transfer, energy transfer or heat generation thereby improving the polymerization initiation function. Particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include a merocyanine, a benzopyrane, a coumarin, an aromatic ketone, an anthracene, a styryl and an oxazole.

Of the sensitizing dyes having an absorption maximum in a wavelength range from 300 to 450 nm, a dye represented by formula (IX) shown below is more preferred from the standpoint of high sensitivity.

Formula (IX)

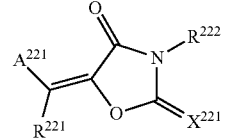

In formula (IX), $A^{221}$ represents an aryl group which may have a substituent or a heteroaryl group which may have a substituent, $X^{221}$ represents an oxygen atom, a sulfur atom or =N(R$^{223}$), and R$^{221}$, R$^{222}$ and R$^{223}$ each independently represents a monovalent non-metallic atomic group, or A$^{221}$ and R$^{221}$ or R$^{222}$ and R$^{223}$ may be combined with each other to form an aliphatic or aromatic ring.

The formula (IX) will be described in more detail below. The monovalent non-metallic atomic group represented by any one of R$^{221}$, R$^{222}$ and R$^{223}$ preferably represents a hydrogen atom, a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

The aryl group which may have a substituent and the heteroaryl group which may have a substituent represented by A$^{221}$ are same as the substituted or unsubstituted aryl group and the substituted or unsubstituted heteroaryl group described for any one of R$^{221}$, R$^{222}$ and R$^{223}$.

Specific examples of such a sensitizing dye preferably used include compounds described in Paragraph Nos. [0047] to [0053] of JP-A-2007-58170, Paragraph Nos. [0036] to [0037] of JP-A-2007-93866 and Paragraph Nos. [0042] to [0047] of JP-A-2007-72816.

Further, sensitizing dyes described in JP-A-2006-189604, JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range from 750 to 1,400 (hereinafter, also referred to as an "infrared absorbing agent") is described below. The infrared absorbing agent used is preferably a dye or a pigment.

As the dye, commercially available dyes and known dyes described in literatures, for example, *Senryo Binran (Dye Handbook)* compiled by The Society of Synthetic Organic Chemistry, Japan (1970) can be utilized. Specifically, the dye includes an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt and a metal thiolate complex.

Of the dyes, a cyanine dye, a squarylium dye, a pyrylium dye, a nickel thiolate complex and an indolenine cyanine dye are particularly preferred. Further, a cyanine dye and an indolenine cyanine dye are more preferred. As particularly preferred examples of the dye, a cyanine dye represented by formula (a) shown below is exemplified.

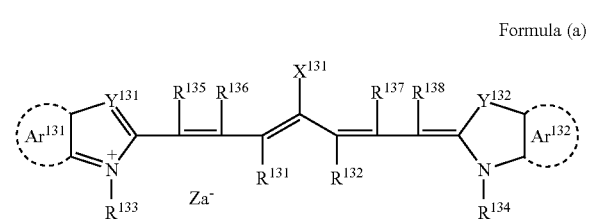

Formula (a)

In formula (a), X$^{131}$ represents a hydrogen atom, a halogen atom, —N(Ph)$_2$, —X$^{132}$-L$^{131}$ or a group shown below. Ph represents a phenyl group.

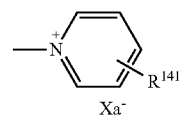

X$^{132}$ represents an oxygen atom, a nitrogen atom or a sulfur atom, L$^{131}$ represents a hydrocarbon group having from 1 to 12 carbon atoms, an aryl group containing a hetero atom (a nitrogen atom, a sulfur atom, an oxygen atom, a halogen atom or a selenium atom) or a hydrocarbon group having from 1 to 12 carbon atoms and containing a hetero atom. Xa$^-$ has the same meaning as Za$^-$ defined hereinafter. R$^{141}$ represents a hydrogen atom or a substituent selected from an alkyl group, an aryl group, a substituted or unsubstituted amino group and a halogen atom.

R$^{131}$ and R$^{132}$ each independently represents a hydrocarbon group having from 1 to 12 carbon atoms. In view of the preservation stability of the temporary adhesive, it is preferred that R$^{131}$ and R$^{132}$ each represents a hydrocarbon group having two or more carbon atoms. Also, R$^{131}$ and R$^{132}$ may be combined with each other to form a ring and in the case of forming a ring, to form a 5-membered or 6-membered ring is particularly preferred.

Ar$^{131}$ and Ar$^{132}$, which may be the same or different, each represents an aryl group which may have a substituent. Preferred examples of the aryl group include a benzene ring group and a naphthalene ring group. Preferred examples of the substituent include a hydrocarbon group having 12 or less carbon atoms, a halogen atom and an alkoxy group having 12 or less carbon atoms. Y$^{131}$ and Y$^{132}$, which may be the same or different, each represents a sulfur atom or a dialkylmethylene group having 12 or less carbon atoms. R$^{133}$ and R$^{134}$, which may be the same or different, each represents a hydrocarbon group having 20 or less carbon atoms which may have a substituent. Preferred examples of the substituent include an alkoxy group having 12 or less carbon atoms, a carboxyl group and a sulfo group. R$^{135}$, R$^{136}$, R$^{137}$ and R$^{138}$, which may be the same or different, each represents a hydrogen atom or a hydrocarbon group having 12 or less carbon atoms. From the standpoint of the easy availability of raw materials, a hydrogen atom is preferred. Za$^-$ represents a counter anion. However, Za$^-$ is not necessary when the cyanine dye represented by formula (a) has an anionic substituent in the structure thereof and the neutralization of charge is not needed. Preferred examples of the counter ion for Za$^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of the temporary adhesive.

Specific examples of the cyanine dye represented by formula (a) include compounds described in Paragraph Nos. [0017] to [0019] of JP-A-2001-133969, Paragraph Nos. [0016] to of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850.

Further, compounds described in Paragraph Nos. [0008] to [0009] of JP-A-5-5005 and Paragraph Nos. [0022] to [0025] of JP-A-2001-222101 are also preferably used.

The infrared absorbing dyes may be used only one kind or in combination of two or more kinds thereof, and may be used together with an infrared absorbing agent other than the infrared absorbing dye, for example, a pigment. As the pigment, compounds described in Paragraph Nos. [0072] to [0076] of JP-A-2008-195018 are preferred.

The content of the sensitizing dye (F) is preferably from 0.05 to 30% by weight, more preferably from 0.1 to 20% by weight, particularly preferably from 0.2 to 10% by weight, based on the total solid content of the temporary adhesive.

(G) Chain Transfer Agent

The temporary adhesive for production of semiconductor device according to the invention preferably contains a chain transfer agent. The chain transfer agent is defined, for example, in *Kobunshi Jiten* (*Polymer Dictionary*), Third Edition, pages 683 to 684, edited by The Society of Polymer Science, Japan (2005). As the chain transfer agent, for example, compounds having SH, PH, SiH or GeH in their molecules are used. The compound donates a hydrogen to a low active radical species to generate a radical or is oxidized and then deprotonated to generate a radical. In the temporary adhesive, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used.

The content of the chain transfer agent is preferably from 0.01 to 20 parts by weight, more preferably from 1 to 10 parts by weight, particularly preferably from 1 to 5 parts by weight, per 100 parts by weight of the total solid content of the temporary adhesive.

(H) Polymerization Inhibitor

To the temporary adhesive according to the invention is preferably added a small amount of a polymerization inhibitor in order to prevent undesired thermal polymerization of the polymer compound (A) and the radical polymerizable monomer (B) during the production or preservation of the temporary adhesive.

As the polymerization inhibitor, for example, hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt are preferably exemplified.

The addition amount of the polymerization inhibitor is preferably from about 0.01 to about 5% by weight based on the total solid content of the temporary adhesive.

(I) Higher Fatty Acid Derivative, etc.

In order to prevent polymerization inhibition due to oxygen, a higher fatty acid derivative or the like, for example, behenic acid or behenic acid amide may be added to the temporary adhesive according to the invention to localize on the surface of the adhesive layer in the process of drying after the coating. The addition amount of the higher fatty acid derivative is preferably from about 0.1 to about 10% by weight based on the total solid content of the temporary adhesive.

(J) Other Additives

Also, the temporary adhesive according to the invention may contain, if desired, various additives, for example, a curing agent, a curing catalyst, a silane coupling agent, a filler, an adherence accelerator, an antioxidant, an ultraviolet absorber or an aggregation inhibitor as long as the effects of the invention are not impaired.

(K) Solvent

The temporary adhesive for production of semiconductor device according to the invention may be coated by dissolving it in a solvent (ordinarily, an organic solvent). The solvent is basically not particularly limited as long as it satisfies solubility of each of the components and coating property of the temporary adhesive.

The organic solvent preferably includes, an ester, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, butyl oxyacetate, methyl methoxyacetate, ethyl methoxyacetate, butyl methoxyacetate, methyl ethoxyacetate or ethyl ethoxyacetate), an alkyl 3-oxypropionate (for example, methyl 3-oxypropionate, ethyl 3-oxypropionate, methyl 3-methoxypropionate, ethyl 3-methoxypropionate, methyl 3-ethoxypropionate or ethyl 3-ethoxypropionate), an alkyl 2-oxypropionate (for example, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate or ethyl 2-ethoxypropionate), methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate or ethyl 2-oxobutanoate; an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate (1-methoxy-2-propanol acetate), propylene glycol monoethyl ether acetate or propylene glycol monopropyl ether acetate; a ketone, for example, methyl ethyl ketone, cyclohexanone, 2-heptanone or 3-heptanone; and an aromatic hydrocarbon, for example, toluene or xylene.

From the standpoint of improving the coated surface state and the like, the solvents are also preferably used in the state of mixing two or more thereof. In this case, a mixed solution composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate is particularly preferred.

The content of the solvent in the coating solution of the temporary adhesive is set such that the total solid content concentration of the temporary adhesive becomes preferably from 5 to 80% by weight, more preferably from 5 to 70% by weight, particularly preferably from 10 to 60% by weight, from the standpoint of coating property.

(L) Surfactant

To the temporary adhesive according to the invention may be added various surfactants from the standpoint of more increasing the coating property. As the surfactant, various surfactants, for example, a fluorine-based surfactant, a nonionic surfactant, a cationic surfactant, an anionic surfactant or a silicone-based surfactant can be used.

In particular, by containing a fluorine-based surfactant in the temporary adhesive according to the invention, the liquid characteristic (particularly, fluidity) of a coating solution prepared is more increased so that the uniformity of coating thickness or the liquid-saving property can be more improved.

Specifically, in the case of forming a film by using a coating solution to which the temporary adhesive containing a fluorine-based surfactant is applied, the interface tension between a surface to be coated and the coating solution is reduced, whereby wettability to the surface to be coated is improved and the coating property on the surface to be coated is increased. This is effective in that even when a thin film of about several μm is formed using a small liquid volume, formation of the film having a little thickness unevenness and a uniform thickness can be performed in a preferable manner.

The fluorine content in the fluorine-based surfactant is preferably from 3 to 40% by weight, more preferably from 5 to 30% by weight, and particularly preferably from 7 to 25% by weight. The fluorine-based surfactant having a fluorine content in the range described above is effective in view of the uniformity of coating thickness and the liquid-saving property and also exhibits good solubility in the temporary adhesive.

Examples of the fluorine-based surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F475, MEGAFAC F479, MEGAFAC F482, MEGAFAC F554, MEGAFAC F780 and MEGAFAC F781 (produced by DIC Corp.), FLUORAD FC430, FLUORAD FC431 and FLUORAD FC171 (produced by Sumitomo 3M Ltd.), SURFLON S-382, SURFLON SC-101, SURFLON SC-103, SURFLON SC-104, SURFLON SC-105, SURFLON SC-1068, SURFLON SC-381, SURFLON SC-383, SURFLON 5393 and SURFLON KH-40 (produced by Asahi Glass Co., Ltd.), and PF636, PF656, PF6320, PF6520 and PF7002 (produced by OMNOVA Solutions Inc.).

Specific examples of the nonionic surfactant include glycerol, trimethylolpropane, trimethylolethane, their ethoxylate and propoxylate (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and a sorbitan fatty acid ester (PLURONIC L10, L31, L61, L62, 10R5, 17R2 and 25R2 and TETRONIC 304, 701, 704, 901, 904 and 150R1 (produced by BASF Corp.) and SOLSPERSE 20000 (produced by The Lubrizol Corp.)).

Specific examples of the cationic surfactant include a phthalocyanine derivative (EFKA-745, produced by Morishita Sangyo K.K.), an organosiloxane polymer (KP341, produced by Shin-Etsu Chemical Co., Ltd.), a (meth)acrylic acid (co)polymer (POLYFLOW No. 75, No. 90 and No. 95 (produced by Kyoeisha Chemical Co., Ltd.) and W001 (produced by Yusho Co., Ltd.).

Specific examples of the anionic surfactant include W004, W005 and W017 (produced by Yusho Co., Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH3OPA and TORAY SILICONE SH8400 (produced by Dow Corning Toray Co., Ltd.), TSF-4440, TSF-4300, TSF-4445, TSF-4460 and TSF-4452 (produced by Momentive Performance Materials Inc.), KP341, KF6001 and KF6002 (produced by Shin-Etsu Silicone Co., Ltd.), and BYK307, BYK323 and BYK330 (produced by BYK-Chemie GmbH).

The surfactants may be used only one kind or in combination of two or more kinds thereof.

The amount of the surfactant added is preferably from 0.001 to 2.0% by weight, more preferably from 0.005 to 1.0% by weight, based on the total solid content of the temporary adhesive.

Next, the adhesive support and the production method of semiconductor device using the temporary adhesive for production of semiconductor device according to the invention described above will be described.

Figure 1B:
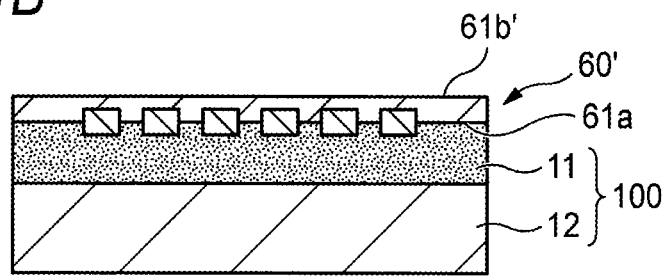

FIG. 1A and FIG. 1B are a schematic cross-sectional view illustrating temporary adhesion of an adhesive support and a device wafer and a schematic cross-sectional view showing a state in which the device wafer temporarily adhered by the adhesive support is thinned, respectively.

According to an embodiment of the invention, first, an adhesive support 100 having an adhesive layer 11 provided on a carrier substrate 12 is prepared as shown in FIG. 1A.

A material of the carrier substrate 12 is not particularly limited and includes, for example, a silicon substrate, a glass substrate and a metal substrate. Taking them into consideration that a silicon substrate which is typically used as a substrate of semiconductor device is hardly contaminated and that an electrostatic chuck which is commonly used in the process of producing a semiconductor device can be used, a silicon substrate is preferred.

The thickness of the carrier substrate 12 is, for example, in a range from 300 μm to 5 mm, and it is not particularly limited.

The adhesive layer 11 can be formed by coating the temporary adhesive for production of semiconductor device according to the invention on the carrier substrate 12 by using a conventionally known method, for example, a spin coating method, a spraying method, a roller coating method, a flow coating method, a doctor coating method or a dipping method, followed by drying.

The thickness of the adhesive layer 11 is, for example, in a range from 1 to 500 μm, and it is not particularly limited.

Then, temporary adhesion of the adhesive support obtained as described above and a device wafer, thinning of the device wafer and release of the device wafer from the adhesive support will be described in detail.

As shown in FIG. 1A, the device wafer 60 (member to be processed) has a plurality of device chips 62 provided on a surface 61a of silicon substrate 61.

The thickness of the silicon substrate 61 is, for example, in a range from 200 to 1,200 μm.

The surface 61a of silicon substrate 61 is pressed against the adhesive layer 11 of the adhesive support 100. Thus, the surface 61a of silicon substrate 61 and the adhesive layer 11 are adhered, whereby the adhesive support 100 and the device wafer 60 are temporarily adhered.

Also, after that, if desired, the adhesion body composed of the adhesive support 100 and the device wafer 60 may be heated (subjected to irradiation of heat), thereby making the adhesion property of the adhesive layer more tough. Thus, since, in addition to that an anchor effect at the interface between the adhesive support and the member to be processed is accelerated, the cohesion failure of the adhesive layer, which may likely occur when the device wafer 60 is subjected to a mechanical or chemical processing described below, can be prevented, the adhesion property of the adhesive support 100 is increased.

The heating temperature is preferably from 50 to 300° C., more preferably from 100 to 250° C., and still more preferably from 150 to 220° C.

The heating time is preferably from 20 seconds to 10 minutes, more preferably from 30 seconds to 5 minutes, and still more preferably from 40 seconds to 3 minutes.

Then, a rear surface 61b of the silicon substrate 61 is subjected to a mechanical or chemical processing, specifically, a thinning processing, for example, grinding or chemical mechanical polishing (CMP) to reduce the thickness (for example, thickness of 1 to 200 μm) of the silicon substrate 61, thereby obtaining a thin device wafer 60' as shown in FIG. 1B.

Also, as the mechanical or chemical processing, after the thinning processing a processing of forming a through hole (not shown) passing through the silicon substrate from the rear surface 61b' of the thin device wafer 60' and forming a though-silicone electrode (not shown) in the through hole may be performed, if desired.

Then, the surface 61a of the thin device wafer 60' is released from the adhesive layer 11 of the adhesive support 100.

A method for the release is not particularly limited, and it is preferably performed by bringing the adhesive layer 100 into contact with a release solution and then, if desired, sliding the thin device wafer 60' to the adhesive support 100 or stripping the thin device wafer 60' from the adhesive support 100. Since the temporary adhesive according to the invention has a high affinity to the release solution, the temporary adhesion between the adhesive layer 100 and the surface 61a of the thin device wafer 60' can be easily released by means of the method described above.

After releasing the thin device wafer 60' from the adhesive support 100, if desired, the thin device wafer 60' is subjected to various known processings, thereby producing a semiconductor device having the thin device wafer 60'.

<Release Solution>

The release solution is described in detail below.

As the release solution, water and the solvent (K) (organic solvent) described above can be used. Further, as the release solution, an organic solvent, for example, acetone or p-menthane is also preferred.

Moreover, from the standpoint of the releasing property, the release solution may contain an alkali, an acid or a surfactant. Furthermore, from the standpoint of the releasing property, an embodiment of mixing two or more kinds of the organic solvents or an embodiment of mixing water and two or more kinds of an alkali, an acid or a surfactant are preferred.

As the alkali, an inorganic alkali agent, for example, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide or lithium hydroxide or an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine or tetramethylammonium hydroxide can be used. The alkali agents can be used individually or in combination of two or more thereof.

As the acid, an inorganic acid, for example, a hydrogen halide, sulfuric acid, nitric acid, phosphoric acid or boric acid or an organic acid, for example, methanesulfonic acid, ethanesulfonic acid, benzenesulfonic acid, p-toluenesulfonic acid, trifluoromethanesulfonic acid, acetic acid, citric acid, formic acid, gluconic acid, lactic acid, oxalic acid or tartaric acid can be used.

As the surfactant, an anionic, cationic, nonionic or amphoteric surfactant can be used. In this case, the content of the surfactant is preferably from 1 to 20% by weight, more preferably from 1 to 10% by weight, based on the release solution.

By controlling the content of the surfactant to the range described above, the releasing property of the thin device wafer 60' from the adhesive support 100 tends to be more improved.

The anionic surfactant is not particularly limited, and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di) sulfonic acid salts, alkylphenoxy polyoxyethylene alkylsulfonic acid salts, polyoxyethylene alkylsulfophenyl ether salts, N-alkyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di) sulfonic acid salts are particularly preferably used.

The cationic surfactant is not particularly limited and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred and alkyl-substituted or unsubstituted phenol ethylene oxide adducts and alkyl-substituted or unsubstituted naphthol ethylene oxide adducts are more preferred.

The amphoteric surfactant is not particularly limited and includes, for example, amine oxide type, for example, alkyldimethylamine oxide, betaine type, for example, alkyl betaine, and amino acid type, for example, sodium salt of alkylamino fatty acid. In particular, alkyldimethylamine oxide which may have a substituent, alkyl carboxyl betaine which may have a substituent and alkyl sulfo betaine which may have a substituent are preferably used. Specifically, compounds represented by formula (2) described in Paragraph No. [0256] of JP-A-2008-203359, compounds represented by formulae (I), (II) and (VI) described in Paragraph No. [0028] of JP-A-2008-276166 and compounds described in Paragraph Nos. [0022] to [0029] of JP-A-2009-47927 can be used.

The release solution can further contain an additive, for example, a defoaming agent or a water softener, if desired.

Figure 2:
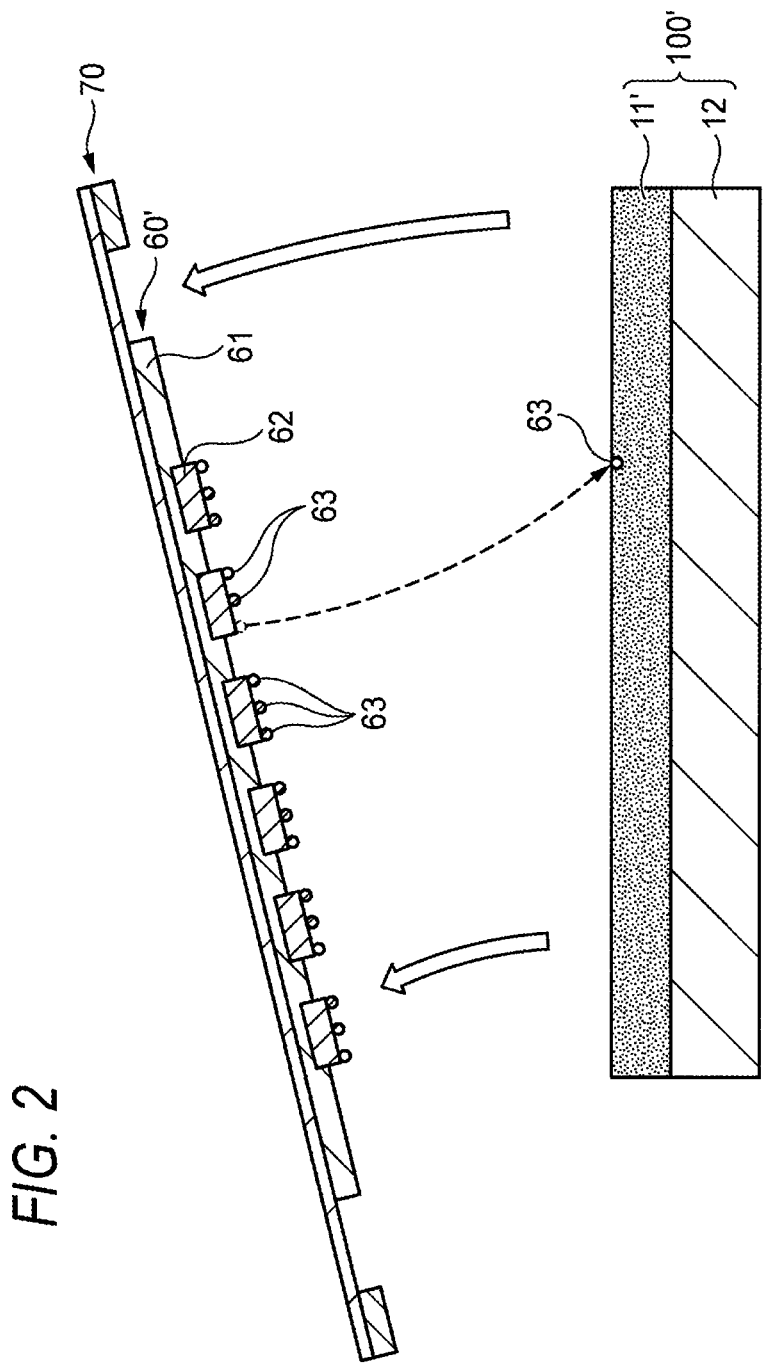
FIG. 2 is a schematic cross-sectional view illustrating release of a temporary adhering state between a conventional adhesive support and a device wafer.

Now, a conventional embodiment is described. FIG. 2 is a schematic cross-sectional view illustrating release of a temporary adhering state between a conventional adhesive support and a device wafer.

In the conventional embodiment, as shown in FIG. 2, except for using as the adhesive support, an adhesive support 100' having an adhesive layer 11' formed from a conventional temporary adhesive provided on a carrier substrate 12, the temporary adhesion of the adhesive support 100' to a device wafer and the thinning processing of the silicon substrate in the device wafer are performed by the same procedures as described with reference to FIG. 1A and FIG. 1B, and then a thin device wafer 60' is released from the adhesive support 100' by the same procedure as described above.

However, according to the conventional temporary adhesive it is difficult to temporarily support a member to be processed with a high adhesive force and to easily release the temporary support for the member processed without imparting damage to the member processed. For example, when a temporary adhesive having a high adhesion property of the conventional temporary adhesives is adopted in order to perform sufficiently temporary adhesion between a device wafer and a carrier substrate, the temporary adhesion between the device wafer and the carrier substrate tends to become too strong. Thus, for example, as shown in FIG. 2, in the case where a tape (for example, a dicing tape) 70 is adhered on a rear surface 61b' of a thin device wafer 60' and the thin device wafer 60' is released from the adhesive support 100' for the purpose of releasing such a strong temporary adhesion, an inconvenience is apt to occur in that a device chip 62 is damaged, for example, a bump 63 is released from the device chip 62 having provided thereon the bump 63.

On the other hand, when a temporary adhesive having a low adhesion property of the conventional temporary adhesives is adopted, the temporary adhesion between a device wafer and a carrier substrate is originally too weak so that an inconvenience is apt to occur in that the device wafer cannot be firmly supported by the =Tier substrate.

However, the adhesive layer formed from the temporary adhesive according to the invention exhibits the sufficient adhesion property, as well as the temporary adhesion between the device wafer 60 and the adhesive support 100 can be easily released, particularly, by bringing the adhesive layer 11 into contact with the release solution. Specifically, due to the temporary adhesive according to the invention, the device wafer 60 can be temporarily supported with the high adhesive force as well as the temporary support for the thin device wafer 60' can be easily released without imparting damage to the thin device wafer 60'.

FIG. 3A, FIG. 3B, FIG. 3C and FIG. 3D are a schematic cross-sectional view illustrating temporary adhesion of an adhesive support and a device wafer provided with a protective layer, a schematic cross-sectional view showing a state in which the device wafer provided with a protective layer temporarily adhered by the adhesive support is thinned, a schematic cross-sectional view showing the thin device wafer provided with a protective layer released from the adhesive support and a schematic cross-sectional view showing the thin device wafer, respectively.

FIG. 4A and FIG. 4B are a schematic cross-sectional view illustrating a state in which the device wafer temporarily adhered by the adhesive support is thinned and a schematic cross-sectional view illustrating a state in which the device wafer provided with a protective layer temporarily adhered by the adhesive support is thinned, respectively.

Figure 3A:
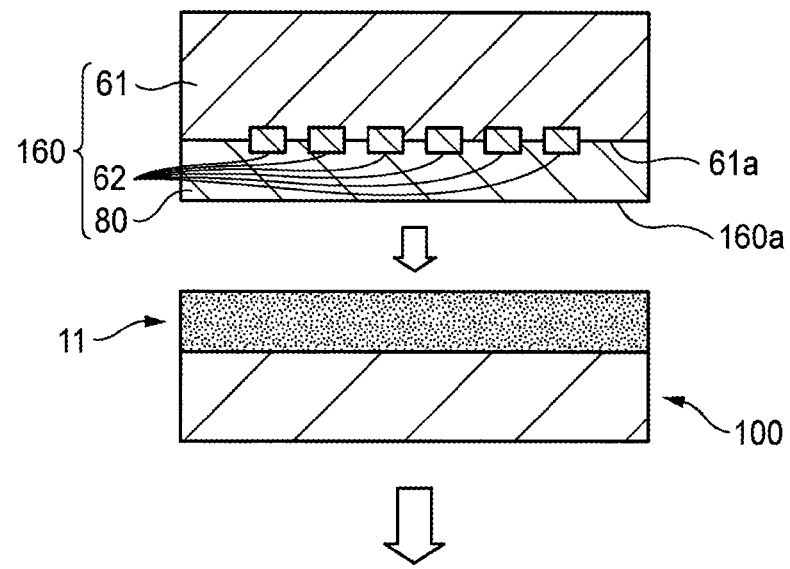
FIG. 3A, FIG. 3B, FIG. 3C and FIG. 3D are a schematic cross-sectional view illustrating temporary adhesion of an adhesive support and a device wafer provided with a protective layer, a schematic cross-sectional view showing a state in which the device wafer provided with a protective layer temporarily adhered by the adhesive support is thinned, a schematic cross-sectional view showing the thin device wafer provided with a protective layer released from the adhesive support and a schematic cross-sectional view showing the thin device wafer, respectively.

According to the first embodiment of the invention described above, a device wafer with protective layer 160 (member to be processed) may be used in place of the device wafer 60, as shown in FIG. 3A.

The device wafer with protective layer 160 is composed of a silicon substrate 61 having a plurality of device chips 62 provided on a surface 61a thereof (member to be processed) and a protective layer 80 for protecting the device chips 62 provided on the surface 61a of the silicon substrate 61.

The thickness of the protective layer 80 is, for example, in a range from 1 to 1,000 μm.

As the protective layer 80, known protective layers can be used without limitation, and the protective layer which can firmly protect the device chips 62 is preferred.

A material constituting the protective layer 80 can use a known compound for the purpose of protecting the member to be processed without limitation. Specifically, a synthetic resin, for example, a phenol resin, an epoxy resin, a melamine resin, a urea resin, an unsaturated polyester resin, an alkyd resin, polyurethane, polyimide, polyethylene, polypropylene, polyvinyl chloride, polystyrene, polyvinyl acetate, Teflon (registered trademark), an ABS resin, an AS resin, an acrylic resin, polyamide, polyacetal, polycarbonate, polyphenylene ether, polybutylene terephthalate, polyethylene terephthalate, cyclic polyolefin, polyphenylene sulfide, polysulfone, polyether sulfone, polyarylate, polyether ether ketone or polyamideimide, or a natural resin, for example, rosin or a natural rubber can be preferably used.

As commercially available products of the material constituting the protective layer 80, for example, CLEARON P-135 (produced by Yasuhara Chemical Co., Ltd.), ARKON P140 (produced by Arakawa Chemical Industries, Ltd.), TOPAS 5013 (produced by Polyplastics Co., Ltd.) and ZEONEX 480R (produced by Zeon Corp.) are exemplified.

The protective layer 80 may contain the compound capable of being incorporated into the temporary adhesive described above, if desired, as long as the effects of the invention are not impaired.

The surface 160a (surface of the protective layer 80 opposite to the silicon substrate 61) of the device wafer with protective layer 160 is pressed against the adhesive layer 11 of the adhesive support 100. Thus, the surface 160a of the device wafer with protective layer 160 and the adhesive layer 11 are adhered, whereby the adhesive support 100 and the device wafer with protective layer 160 are temporarily adhered.

Figure 3B:
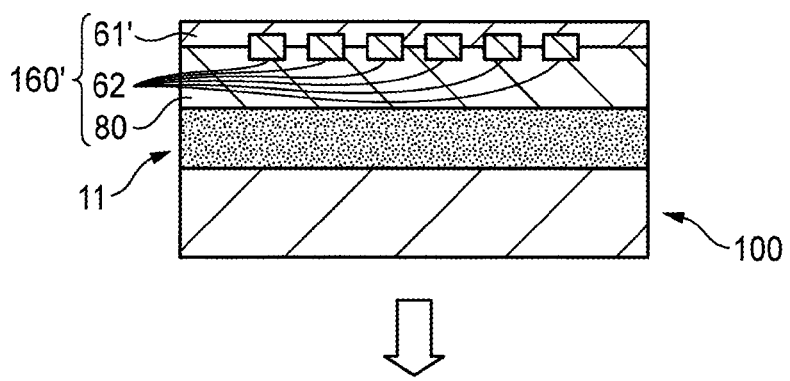

Then, the thickness of the silicon substrate 61 is reduced in the same manner as described above (for example, to from a silicon substrate 61' having a thickness of 1 to 200 μm), thereby obtaining a thin device wafer with protective layer 160' as shown in FIG. 3B.

Figure 3C:
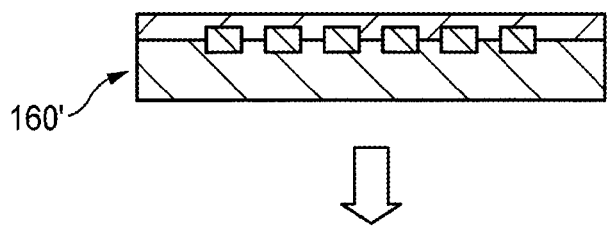

Then, the surface 160a of the thin device wafer with protective layer 160' is released from the adhesive layer 11 of the adhesive support 100 in the same manner as described above, thereby obtaining the thin device wafer with protective layer 160' as shown in FIG. 3C.

Figure 3D:
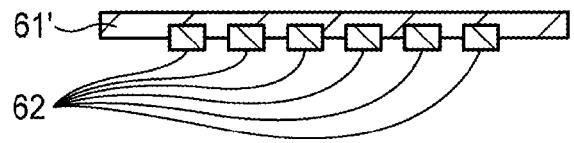

Next, the protective layer 80 of the thin device wafer with protective layer 160' is removed from the silicon substrate 61' and the device chip 62, thereby obtaining a thin device wafer having the device chip 62 provided on the silicon substrate 61' as shown in FIG. 3D.

For the removal of the protective layer 80, any known methods can be adopted. For example, (1) a method of dissolving and removing the protective layer 80 with a solvent, (2) a method of adhering a peeling tape to the protective layer 80 and peeling mechanically the protective layer 80 from the silicon substrate 61' and the device chips 62, and (3) a method of decomposing the protective layer 80 or increasing releasing property of the protective layer 80 by performing exposure to light, for example, an ultraviolet ray or an infrared ray, or laser irradiation are exemplified.

The methods (1) and (3) have an advantage in that the removal of the protective layer 80 is easy because the function in these methods extends to the entire surface of the protective layer.

The method (2) has an advantage in that it can be performed at room temperature without requiring a particular device.

The embodiment using the device wafer with protective layer 160 in place of the device wafer 60 as the member to be processed is effective in the case where TTV (total thickness variation) of the thin device wafer obtained by thinning of the device wafer 60 temporary adhered by the adhesive support 100 is intended to be more reduced (that is, in the case where the flatness of the thin device wafer is intended to be more increased).

Specifically, in the case where the device wafer 60 temporary adhered by the adhesive support 100 is thinned, as shown in FIG. 4A, an irregular shape on the device wafer 60 based on a plurality of the device chips 62 is apt to be transferred to the rear surface 61b' of the thin device wafer 60' to may become an element for increasing the TTV.

On the other hand, in the case where the device wafer with protective layer 160 temporary adhered by the adhesive support 100 is thinned, as shown in FIG. 4B, it is possible to almost eliminate the irregular shape on the contact surface of the device wafer with protective layer 160 with the adhesive support 100 because the plurality of the device chips 62 are protected by the protective layer. Thus, even when such a device wafer with protective layer 160 is subjected to the thinning in the state of being supported by the adhesive support 100, the fear that the shape derived from the plurality of the device chips 62 is transferred to the rear surface 61b'' of the thin device wafer 160' is reduced and as a result, the TTV of the thin device wafer finally obtained can be more reduced.

Further, because the temporary adhesive according to the invention contains the heat radical polymerization initiator (C), the adhesive layer 11 can be made as an adhesive layer in which the adhesion property decreases by the irradiation of heat. In this case, specifically, the adhesive layer can be made as a layer which has an adhesive property before being subjected to the irradiation of heat and in which the adhesion property is decreased or lost in the region to which heat is irradiated.

Moreover, in the case where the temporary adhesive according to the invention further contains the photo-radical polymerization initiator (D), the adhesive layer 11 can be made as an adhesive layer in which the adhesion property decreases by the irradiation of active light or radiation. In this case, specifically, the adhesive layer can be made as a layer which has an adhesive property before being subjected to the irradiation of active light or radiation and in which the adhesion property is decreased or lost in the region to which active light or radiation is irradiated.

Therefore, according to the invention, before adhering the adhesive support 100 to the device wafer 60, active light or radiation, or heat may be irradiated to a surface of the adhesive surface 11 of the adhesive support 100, which is to be adhered to the device wafer 60.

For example, the adhesive layer is converted to an adhesive layer in which a low adhesive region and a high adhesive region are formed by the irradiation of active light or radiation, or heat, and then temporary adhesion of the adhesive support to the member to be processed may be performed. This embodiment described below.

FIG. 5A shows a schematic cross-sectional view illustrating exposure of the adhesive support, and FIG. 5B shows a schematic top view of a mask.

First, the adhesive layer 11 of the adhesive support 100 is irradiated by active light or radiation 50 (that is exposed) through a mask 40.

As shown in FIG. 5A and FIG. 5B, the mask 40 is composed of a light-transmitting region 41 provided in the central area and a light-shielding region 42 provided in the peripheral area.

Thus, the exposure described above is a pattern exposure in which the central area of the adhesive layer 11 is exposed, but the peripheral area surrounding the central area is not exposed.

Figure 6B:
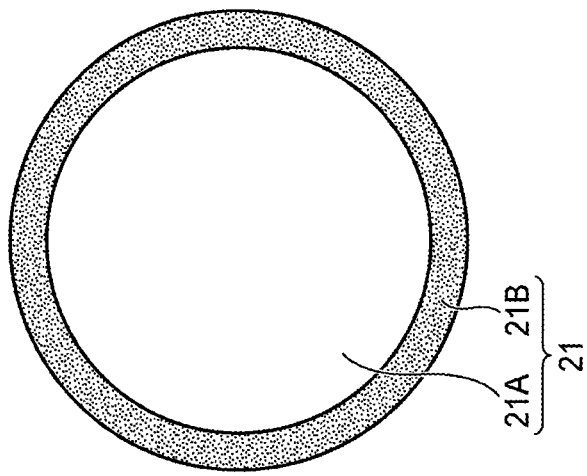
FIG. 6B shows a schematic top view of the adhesive support subjected to pattern exposure.
Figure 6A:
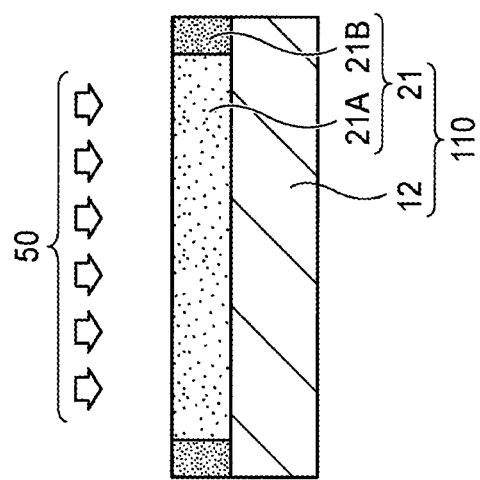
FIG. 6A shows a schematic cross-sectional view of the adhesive support subjected to pattern exposure.

FIG. 6A shows a schematic cross-sectional view of the adhesive support subjected to pattern exposure, and FIG. 6B shows a schematic top view of the adhesive support subjected to pattern exposure.

As described above, in the case where the adhesive layer 11 is an adhesive layer in which the adhesion property decreases by the irradiation of active light or radiation, the adhesive support 100 is converted to an adhesive support 110 having an adhesive layer 21 in which a low adhesive region 21A and a high adhesive region 21B are formed in the central area and the peripheral area, respectively, as shown in FIG. 6A and FIG. 6B.

In the specification, the term "low adhesive region" means a region having a low adhesion property in comparison with the "high adhesive region" and includes a region having no adhesion property (specifically, a "non-adhesive region"). Similarly, the term "high adhesive region" means a region having a high adhesion property in comparison with the "low adhesive region".

In the adhesive support 110, the low adhesive region 21A and the high adhesive region 21B are provided by the pattern exposure using the mask 40, the respective areas and shapes of the light-transmitting region and the light-shielding region in the mask 40 can be controlled in an order of micron to nanometer. Thus, since the respective areas and shapes of the high adhesive region 21B and the low adhesive region 21A formed in the adhesive layer 21 of the adhesive support 110 can be finely controlled by the pattern exposure, the adhesion property of the adhesive layer as a whole can be controlled in a high accuracy and easily to an adhesive property in such a degree that not only the silicon substrate 61 of the device wafer 60 is temporarily supported more firmly and easily but also the temporary support for the silicon substrate of the thin display wafer 60' is more easily released without imparting damage to the thin display wafer 60'.

Also, in the high adhesive region 21B and the low adhesive region 21A in the adhesive support 110, the surface properties thereof are differentiated by the pattern exposure, but they are integrated as a structure. Therefore, there is no large difference in the mechanical properties between the high adhesive region 21B and the low adhesive region 21A, and even when the surface 61a of the silicon substrate 61 of the device wafer 60 is adhered to the adhesive layer 21 of the adhesive support 110, and then the rear surface 61b of the silicon substrate 61 is subjected to the thinning processing or the processing for forming a through-silicone electrode, a difference in the pressure relating to the processing (for example, grinding pressure or a polishing pressure) hardly arises between the region of the back surface 61b corresponding to the high adhesive region 21B of the adhesive layer 21 and the region of the back surface 61b corresponding to the low adhesive region 21A, and the influence of the high adhesive region 21B and the low adhesive region 21A on the processing accuracy in the processing described above is small. This is particularly effective in the case of obtaining a thin device wafer 60' having a thickness, for example, from 1 to 200 μm, which is likely to cause the problem described above.

Therefore, the embodiment using the adhesive support 110 is preferred as an embodiment wherein the silicon substrate 61 can be temporarily supported more firmly and easily while suppressing the influence on the processing accuracy when the silicon substrate 61 of the device wafer 60 is subjected to the processing described above and the temporary support for the thin display wafer 60' can be more easily released without imparting damage to the thin display wafer 60'.

Also, the adhesive layer 11 is converted to an adhesive layer in which the adhesion property decreases towards the outer surface from the inner surface on the substrate side by the irradiation of active light or radiation, or heat, and then temporary adhesion of the adhesive support to the member to be processed may be peformed. This embodiment described below.

Figure 7:
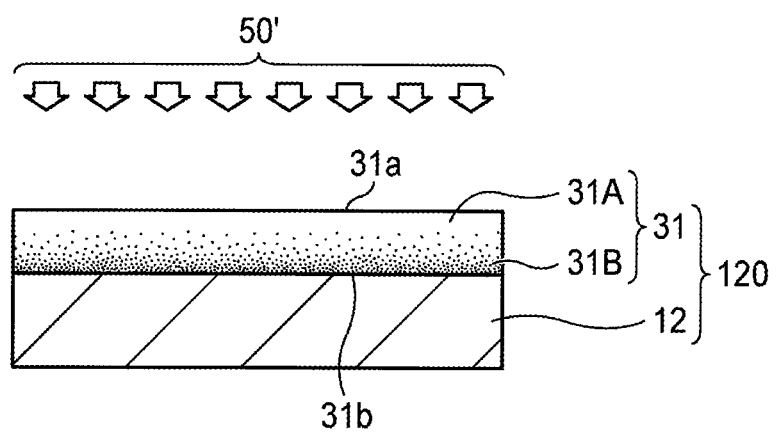
FIG. 7 shows a schematic cross-sectional view illustrating irradiation of active light or radiation, or heat to the adhesive support.

FIG. 7 is a schematic cross-sectional view illustrating irradiation of active light or radiation, or heat to the adhesive support.

First, active light or radiation, or heat 50' is irradiated to the outer surface of the adhesive layer 11, whereby the adhesive support 100 is converted into an adhesive support 120 having an adhesive layer 31 in which the adhesion property is decreased toward the outer surface 31a from the inner surface 31b on the substrate side, as shown in FIG. 7.

Specifically, the adhesive layer 31 comes to have a low adhesive region 31A and a high adhesive region 31B on the outer surface 31a side and the inner surface 31b side, respectively.

Such an adhesive layer 31 can be easily formed by controlling the irradiation dose of the active light or radiation, or heat 50' to such an irradiation dose that the active light or radiation, or heat 50' sufficiently irradiates the outer surface 31a, but the active light or radiation, or heat 50' does not reach to the inner surface 31b.

The change in the irradiation dose as described above can be easily performed by changing the setting of an exposure machine or a heating device so that not only the cost of equipment can be reduced but also formation of the adhesive layer 21 or 31 can be performed without spending a long time.

Also, in the embodiment according to the invention described above, the adhesive layer 31 which is integral as a structure but is positively caused to have lower adhesion property on the outer surface 31a than the adhesion property on the inner surface 31b is formed by combining the adhesive layer 11 and the irradiation method and therefore, another layer, for example, a separating layer need not be provided.

As described above, the formation of the adhesive layer 31 is easy.

Further, each of the adhesion property on the outer surface 31a and the adhesion property on the inner surface 31b can be controlled with good precision, for example, by selecting the material constituting the adhesive layer 11 and adjusting the irradiation dose of the active light, radiation or heat.

As a result, the adhesion property of the adhesive layer 31 to each of the substrate 12 and the silicon substrate 61 can be easily controlled with high precision to such a degree of adhesion property that not only the silicon substrate 61 of the device wafer 60 can be temporarily supported firmly and easily but also the temporary support for the silicon substrate of the thin device wafer 60' can be easily released without imparting damage to the thin device wafer 60'.

Therefore, the embodiment using the adhesive support 120 is also preferred as an embodiment wherein not only the silicon substrate 61 can be temporarily supported more firmly and easily when the silicon substrate 61 of the device wafer 60 is subjected to the processing described above but also the temporary support for the thin display wafer 60' can be more easily released without imparting damage to the thin display wafer 60'.

The production method of semiconductor device according to the invention is not limited to the embodiments described above, and appropriate modifications, improvements and the like can be made therein.

In the embodiments described above, the adhesive layer formed from the temporary adhesive for production of semiconductor device according to the invention is provided on the carrier substrate to constitute the adhesive support before the temporary adhesion of a device wafer, but the adhesive layer may be formed on a member to be processed, for example, a device wafer and then the member to be processed having the adhesive layer provided thereon may be temporary adhered to the substrate.

Also, for example, a mask used for the pattern exposure may be a binary mask or a halftone mask.

Also, the exposure is mask exposure through a mask, but may be selective exposure by drawing using also an electron beam or the like.

In the embodiments described above, the adhesive layer has a single-layer structure, but the adhesive layer may have a multilayer structure. Examples of the method for forming an adhesive layer having a multilayer structure include a method of stepwise coating an adhesive composition by the conventionally known method described above before irradiation of active light or radiation, and a method of coating an adhesive composition by the conventionally known method described above after irradiation of active light or radiation. In the embodiment where the adhesive layer has a multilayer structure, for example, in the case where the adhesive layer 11 is an adhesive layer in which the adhesion property decreases by the irradiation of active light or radiation, or heat, the adhesion property as an entire adhesive layer can also be decreased by decreasing the adhesion property between respective layers by the irradiation of active light or radiation, or heat.

In the embodiments described above, the member to be processed which is supported by the adhesive support is a silicon substrate, but the member to be processed is not limited thereto and may be any member to be processed which can be subjected to a mechanical or chemical processing in the production method of semiconductor device.

For example, the member to be processed includes a compound semiconductor substrate, and specific examples of the compound semiconductor substrate include an SiC substrate, an SiGe substrate, a ZnS substrate, a ZnSe substrate, a GaAs substrate, an InP substrate and a GaN substrate.

Further, in the embodiments described above, the mechanical or chemical processing applied to the silicon substrate which is supported by the adhesive support is the thinning processing of the silicon substrate or the processing for forming a through-silicon electrode, but the mechanical or chemical processing is not limited thereto and may be any processing required in the production method of semiconductor device.

In addition, the light-transmitting region and the light-shielding region in the mask, the high adhesive region and the low adhesive region in the adhesive layer, and the shape, dimension, number, arrangement portion and the like of device chip in the device wafer, which are exemplified in the embodiments described above, are arbitrary and not limited as long as the invention can be achieved.

EXAMPLES

The invention will be described more specifically with reference to the examples, but the invention should not be construed as being limited thereto as long as the gist of the invention is not deviated. All "part" and "%" therein are weigh basis unless otherwise specified.

<Formation of Adhesive Support

Each liquid adhesive composition (temporary adhesive) having the composition shown in Table 1 below was coated on a 4-inch Si wafer by a spin coater (Opticoat MS-A100, produced by Mikasa Co., Ltd., 1,200 rpm, 30 seconds) and then baked at 100° C. for 30 seconds to form Wafer 1 having provided thereon an adhesive layer having a thickness of 10 μm (that is, an adhesive support).

TABLE 1

| | Polymer Compound | | Polymerizable Monomer | | Photo-radical Polymerization Initiator | | Heat Radical Polymerization Initiator | | Solvent | |
|---|---|---|---|---|---|---|---|---|---|---|
| | Kind | Parts by Weight | Kind | Parts by Weight | Kind | Parts by Weight | Kind | Parts by Weight | Kind | Parts by Weight |
| Liquid Adhesive Composition (1) | Polymer Compound (1) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (2) | Polymer Compound (2) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (3) | Polymer Compound (3) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (4) | Polymer Compound (4) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (5) | Polymer Compound (9) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (6) | Polymer Compound (11) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (7) | Polymer Compound (12) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (8) | Polymer Compound (14) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (9) | Polymer Compound (35) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (10) | Polymer Compound (36) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (11) | Polymer Compound (38) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (12) | Polymer Compound (39) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (13) | Polymer Compound (40) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (14) | Polymer Compound (42) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (15) | Polymer Compound (43) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (16) | Polymer Compound (44) | 20 | Polymerizable Monomer (1) | 20 | Photo-radical Polymerization Initiator (1) | 2 | Heat Radical Polymerization Initiator (1) | 2 | Solvent (1) | 56 |

TABLE 1-continued

| | Polymer Compound | | Polymerizable Monomer | | Photo-radical Polymerization Initiator | | Heat Radical Polymerization Initiator | | Solvent | |
|---|---|---|---|---|---|---|---|---|---|---|
| | Kind | Parts by Weight | Kind | Parts by Weight | Kind | Parts by Weight | Kind | Parts by Weight | Kind | Parts by Weight |
| Liquid Adhesive Composition (17) | Polymer Compound (45) | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (18) | Polymer Compound (1) | 10 | Polymerizable Monomer (1) | 30 | Photo-radical Polymerization Initiator (1) | 2 | Heat Radical Polymerization Initiator (1) | 2 | Solvent (1) | 56 |
| Liquid Adhesive Composition (19) | Polymer Compound (1) | 30 | Polymerizable Monomer (1) | 10 | Photo-radical Polymerization Initiator (1) | 2 | Heat Radical Polymerization Initiator (1) | 2 | Solvent (1) | 56 |
| Liquid Adhesive Composition (20) | Polymer Compound (1) | 20 | Polymerizable Monomer (2) | 20 | Photo-radical Polymerization Initiator (1) | 2 | Heat Radical Polymerization Initiator (1) | 2 | Solvent (1) | 56 |
| Liquid Adhesive Composition (21) | Polymer Compound (3) | 20 | Polymerizable Monomer (2) | 20 | Photo-radical Polymerization Initiator (1) | 2 | Heat Radical Polymerization Initiator (1) | 2 | Solvent (1) | 56 |
| Liquid Adhesive Composition (22) | Polymer Compound (1) | 20 | Polymerizable Monomer (3) | 20 | Photo-radical Polymerization Initiator (1) | 2 | Heat Radical Polymerization Initiator (1) | 2 | Solvent (1) | 56 |
| Liquid Adhesive Composition (23) | Polymer Compound (3) | 20 | Polymerizable Monomer (3) | 20 | Photo-radical Polymerization Initiator (1) | 2 | Heat Radical Polymerization Initiator (1) | 2 | Solvent (1) | 56 |
| Liquid Adhesive Composition (24) | Polymer Compound (36) | 20 | Polymerizable Monomer (3) | 20 | Photo-radical Polymerization Initiator (1) | 2 | Heat Radical Polymerization Initiator (1) | 2 | Solvent (1) | 56 |
| Liquid Adhesive Composition (25) | Polymer Compound (1) | 20 | Polymerizable Monomer (1) | 20 | Photo-radical Polymerization Initiator (2) | 2 | Heat Radical Polymerization Initiator (1) | 2 | Solvent (1) | 56 |
| Liquid Adhesive Composition (26) | Polymer Compound (1) | 20 | Polymerizable Monomer (1) | 20 | None | 0 | Heat Radical Polymerization Initiator (1) | 2 | Solvent (1) | 58 |
| Liquid Adhesive Composition (1) for Comparative Example | Polymer Compound (1) for Comparative Example | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (2) for Comparative Example | Polymer Compound (2) for Comparative Example | 20 | Polymerizable Monomer (1) | 20 | Photo-radical Polymerization Initiator (1) | 2 | Heat Radical Polymerization Initiator (1) | 2 | Solvent (1) | 56 |
| Liquid Adhesive Composition (3) for Comparative Example | Polymer Compound (1) | 20 | Polymerizable Monomer (1) | 20 | Photo-radical Polymerization Initiator (1) | 2 | None | 0 | Solvent (1) | 58 |
| Liquid Adhesive Composition (4) for Comparative Example | Polymer Compound (1) | 20 | Polymerizable Monomer (1) | 20 | None | 0 | None | 0 | Solvent (1) | 60 |
| Liquid Adhesive Composition (5) for Comparative Example | Polymer Compound (1) | 20 | None | 0 | None | 0 | Heat Radical Polymerization Initiator (1) | 2 | Solvent (1) | 78 |
| Liquid Adhesive Composition (6) for Comparative Example | Polymer Compound (1) | 20 | Comparative Polymerizable Monomer (1) | 20 | None | 0 | Comparative Heat Acid Generating Agent (1) | 2 | Solvent (1) | 58 |

The components shown in Table 1 above are as follows.

[(A) Polymer Compound]

The polymer compounds having the structures described hereinbefore were used.

[(B) Polymerizable Monomer]

Polymerizable monomer (1): UA-1100H (tetrafunctional urethane acrylate, produced by Shin-Nakamura Chemical Co., Ltd.)

Polymerizable monomer (2): A-TMPT (trimethylolpropane triacrylate, produced by Shin-Nakamura Chemical Co., Ltd.)

Polymerizable monomer (3): A-DPH (hexafunctional acrylate, produced by Shin-Nakamura Chemical Co., Ltd.)

[(C) Heat Radical Polymerization Initiator]

Nonionic Heat Radical Polymerization Initiator (1): PERBUTYL Z (tert-butyl peroxybenzoate, decomposition temperature (10 hour half-life temperature=104° C.), produced by NOF Corp.)

[(D) Photo-Radical Polymerization Initiator]

Nonionic Photo-radical Polymerization Initiator (1): IRGACURE OXE 02 (produced by BASF Corp.)

Nonionic Photo-radical Polymerization Initiator (2): IRGACURE 127 (produced by BASF Corp.)

[(K) Solvent]

Solvent (1): 1-Methoxy-2-propanol acetate

Polymer Compound (1) for Comparative Example: Ethylene/butyl acrylate copolymer (butyl acrylate: 35% by weight, produced by Sigma-Aldrich Corp.)

Polymer Compound (2) for Comparative Example: Polymethyl methacrylate (Mw: 15,000, produced by Sigma-Aldrich Corp.)

Comparative Polymerizable Monomer (1): 2,2-Bis(4-glycidyloxyphenyl)propane (produced by Tokyo Chemical Industry Co., Ltd.)

Comparative Heat Acid Generating Agent (1): Isopropyl p-toluenesulfonate (produced by Tokyo Chemical Industry Co., Ltd.)

<Preparation of Member to be Processed>

As a member to be processed having no protective layer, a 4-inch Si wafer was used as it was.

As a member to be processed having a protective layer, a 20% by weight p-menthane solution of compound for protective layer shown below was coated on a 4-inch Si wafer by a spin coater (Opticoat MS-A100, produced by Mikasa Co., Ltd., 1,200 rpm, 30 seconds) and then baked at 100° C. for 300 seconds to form a wafer having provided thereon a protective layer having a thickness of 20 μm.

In spite of the presence or absence of the protective layer, the wafer described above as the member to be processed is referred collectively to as Wafer 2.

[Compound for Protective Layer]

Compound for Protective Layer (1): CLEARON P-135 (produced by Yasuhara Chemical Co., Ltd.)

Compound for Protective Layer (2): ARKON P140 (produced by Arakawa Chemical Industries, Ltd.)

Compound for Protective Layer (3): TOPAS 5013 (produced by Polyplastics Co., Ltd.)

Compound for Protective Layer (4): ZEONEX 480R (produced by Zeon Corp.)

<Preparation of Adhesion Property Test Piece>

Using the temporary adhesive composed of each liquid adhesive composition as shown in Table 2 and Table 3 below, each process of "exposure", "bonding with pressure" and "baking" were conducted in this order to prepare an adhesion property test piece.

[Exposure]

From the adhesive layer side of Wafer 1, a central portion of the adhesive layer excluding an outer peripheral portion of 5 mm was exposed through a mask protecting (shielding) the outer peripheral portion of 5 mm of the adhesive layer using an UV exposure device (LC8, produced by Hamamatsu Photonics K.K.) with light having a wavelength of 254 nm at an exposure dose of 100 mJ/cm$^2$.

In the case where Liquid Adhesive Composition (26) and Liquid Adhesive Compositions (4), (5) and (6) for Comparative Example, each of which did not contain a photoradical polymerization initiator, were used, the exposure process was not conducted to move to the next process.

[Bonding with Pressure]

Wafer 2 was superimposed on the adhesive layer of Wafer 1 and adhered under pressure of 20 N/cm$^2$ at 25° C. for 30 seconds. In the case where Wafer 2 was the 4-inch Si wafer provided with the protective layer, the protective layer was superimposed on the adhesive layer of Wafer 1 and adhered under pressure as described above.

[Baking]

Wafer 1 and Wafer 2 adhered were heated at 180° C. for 60 seconds.

<Adhesive Force Measurement of Adhesion Property Test Piece>

As to the shear adhesive force of the adhesion property test piece prepared under the conditions described in Table 2 and Table 3, tensile measurement was performed in the direction along the surface of the adhesive layer under the condition of 250 mm/min using a tensile tester (Digital Force Gauge Model ZP-50N, produced by Imada Co., Ltd.). The results are shown in Table 2 and Table 3 below.

<Releasing Property>

The test piece prepared under the conditions described in Table 2 and Table 3 was immersed in the release solution described in Table 2 and Table 3 at 25° C. for 180 minutes. The test piece was taken from the release solution, washed carefully with pure water, and dried at 25° C. The test piece was pulled in the direction perpendicular to the adhesive layer, and the case where the Si wafer could be peeled with a very small force without imparting damage to the Si wafer was ranked as "A", the case where the Si wafer could be peeled with a small force without imparting damage to the Si wafer was ranked as "B", the case where the Si wafer could be peeled in a level having no real damage although some force was needed for the peeling was ranked as "C", and the case where the Si wafer could not be peeled was ranked as "D". The occurrence of the damage of the Si wafer was visually confirmed.

TABLE 2

| | Liquid Adhesive Composition | Protective Layer of Member to be Processed (Number indicates number of compound for protective layer used) | Result of Adhesive Force Measurement Adhesion Property (N/25 mm$^2$) | Releasing Property | |
|---|---|---|---|---|---|
| | | | | Kind of Release Solution | Result |
| Example 1 | (1) | None | 40 | 2-Heptanone | B |
| Example 2 | (2) | None | 40 | 2-Heptanone | B |
| Example 3 | (3) | None | 40 | 2-Heptanone | B |
| Example 4 | (4) | None | 40 | 2-Heptanone | B |
| Example 5 | (5) | None | 30 | 2-Heptanone | B |
| Example 6 | (6) | None | 25 | 2-Heptanone | B |
| Example 7 | (7) | None | 25 | 2-Heptanone | B |
| Example 8 | (8) | None | 35 | 2-Heptanone | B |
| Example 9 | (9) | None | 35 | 2-Heptanone | B |
| Example 10 | (10) | None | 35 | 2-Heptanone | B |
| Example 11 | (11) | None | 35 | 2-Heptanone | B |
| Example 12 | (12) | None | 45 | 2-Heptanone | B |
| Example 13 | (13) | None | 45 | 2-Heptanone | B |
| Example 14 | (14) | None | 50 | 2-Heptanone | B |
| Example 15 | (15) | None | 35 | 2-Heptanone | B |
| Example 16 | (16) | None | 40 | 2-Heptanone | B |
| Example 17 | (17) | None | 45 | 2-Heptanone | B |
| Example 18 | (18) | None | 38 | 2-Heptanone | B |

TABLE 2-continued

| | Liquid Adhesive Composition | Protective Layer of Member to be Processed (Number indicates number of compound for protective layer used) | Result of Adhesive Force Measurement Adhesion Property (N/25 mm$^2$) | Releasing Property | |
|---|---|---|---|---|---|
| | | | | Kind of Release Solution | Result |
| Example 19 | (19) | None | 42 | 2-Heptanone | B |
| Example 20 | (20) | None | 42 | 2-Heptanone | B |
| Example 21 | (21) | None | 42 | 2-Heptanone | B |
| Example 22 | (22) | None | 45 | 2-Heptanone | B |
| Example 23 | (23) | None | 45 | 2-Heptanone | B |
| Example 24 | (24) | None | 40 | 2-Heptanone | B |
| Example 25 | (25) | None | 28 | 2-Heptanone | C |

TABLE 3

| | Liquid Adhesive Composition | Protective Layer of Member to be Processed (Number indicates number of compound for protective layer used) | Result of Adhesive Force Measurement Adhesion Property (N/25 mm$^2$) | Releasing Property | |
|---|---|---|---|---|---|
| | | | | Kind of Release Solution | Result |
| Example 26 | (26) | None | 40 | 2-Heptanone | C |
| Example 27 | (1) | (1) | 40 | p-Menthane | A |
| Example 28 | (3) | (1) | 40 | p-Menthane | A |
| Example 29 | (4) | (1) | 40 | p-Menthane | A |
| Example 30 | (1) | (2) | 40 | p-Menthane | A |
| Example 31 | (3) | (2) | 40 | p-Menthane | A |
| Example 32 | (4) | (2) | 40 | p-Menthane | A |
| Example 33 | (1) | (3) | 40 | p-Menthane | A |
| Example 34 | (3) | (3) | 40 | p-Menthane | A |
| Example 35 | (4) | (3) | 40 | p-Menthane | A |
| Example 36 | (1) | (4) | 40 | p-Menthane | A |
| Example 37 | (3) | (4) | 40 | p-Menthane | A |
| Example 38 | (4) | (4) | 40 | p-Menthane | A |
| Example 39 | (26) | (1) | 40 | p-Menthane | B |
| Comparative Example 1 | Comparative Liquid Adhesive Composition (1) | None | 10 | 2-Heptanone | B |
| Comparative Example 2 | Comparative Liquid Adhesive Composition (2) | None | 10 | 2-Heptanone | B |
| Comparative Example 3 | Comparative Liquid Adhesive Composition (3) | None | 2 | 2-Heptanone | B |
| Comparative Example 4 | Comparative Liquid Adhesive Composition (4) | None | 10 | 2-Heptanone | B |
| Comparative Example 5 | Comparative Liquid Adhesive Composition (5) | None | 2 | 2-Heptanone | B |
| Comparative Example 6 | Comparative Liquid Adhesive Composition (6) | None | 2 | 2-Heptanone | B |

As described above, in Comparative Examples 1 to 6 using the temporary adhesive which did not correspond to the temporary adhesive according to the invention, the adhesion property was insufficient, although the good result was obtained with respect to the releasing property.

On the other hand, Examples 1 to 39 using the temporary adhesive according to the invention not only provided the good result with respect to the releasing property but also exhibited the excellent adhesion property.

Thus, the temporary adhesive according to the invention not only can temporarily support a member to be processed (for example, a semiconductor wafer) with a high adhesive force when the member to be processed is subjected to a mechanical or chemical processing, but also can easily release the temporary support for the member processed without imparting damage to the member processed.

Also, the region exposed to light in the adhesive layer formed through the exposure process did not exhibit the adhesion property at all. Since the adhesive support capable of adhering the member to be processed only by the outer peripheral portion of the adhesive layer thereof can be formed according to the technique, particularly, in the case where the member to be processed is a device wafer, when the adhesive support is released from the device wafer, it is possible to more reduce damage of the inner portion of the device wafer.

INDUSTRIAL APPLICABILITY

According to the invention, a temporary adhesive for production of semiconductor device, which not only can temporarily support a member to be processed (for example, a semiconductor wafer) with a high adhesive force when the member to be processed is subjected to a mechanical or chemical processing, but also can easily release (with high releasing property) the temporary support for the member processed without imparting damage to the member processed, and an adhesive support and a production method of semiconductor device using the same can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Sep. 28, 2012 (Japanese Patent Application No. 2012-218584), and the contents thereof are incorporated herein by reference.

DESCRIPTION OF REFERENCE NUMERALS AND SIGNS 11, 11', 21, 31: Adhesive layer
12: Carrier substrate
21A, 31A: Low adhesive region
21B, 31B: High adhesive region
40: Mask
41: Light-transmitting region
42: Light-shielding region
50: Active light or radiation
50': Active light or radiation, or heat
60: Device wafer
60': Thin device wafer
61, 61': Silicon substrate
62: Device chip
63: Bump
70: Tape
80: Protective layer
100, 100', 110, 120: Adhesive support
160: Device wafer with protective layer
160': Thin device wafer with protective layer

The invention claimed is:

1. A production method of semiconductor device having a member processed comprising:

adhering a first surface of a member to be processed to a substrate through an adhesive layer formed from a temporary adhesive containing (A) a polymer compound having a radical polymerizable group in a side chain of the polymer compound, (B) a radical polymerizable monomer, and (C) a heat radical polymerization initiator;

conducting a mechanical or chemical processing on a second surface which is different from the first surface of the member to be processed to obtain the member processed; and releasing the first surface of the member processed from the adhesive layer, said releasing step comprising bringing the adhesive layer into contact with a release solution, wherein the production method comprises: irradiating active light or radiation, or heat to a surface of the adhesive layer which is to be adhered to the first surface of a member to be processed, before the adhering a first surface of a member to be processed to a substrate through the adhesive layer, and active light or radiation, or heat is irradiated to the outer surface of the adhesive layer before adhesion, so that adhesion property is decreased toward the outer surface from the inner surface on the substrate side.

2. The production method of semiconductor device according to claim 1, which further comprises: heating the adhesive layer at a temperature from 50 to 300° C., after the adhering a first surface of the member to be processed to a substrate through the adhesive layer and before the conducting a mechanical or chemical processing on a second surface which is different from the first surface of the member to be processed to obtain the member processed.

3. The production method of semiconductor device according to claim 1, wherein pattern exposure is conducted to the adhesive layer.

4. The production method according to claim 1, wherein the release solution contains an organic solvent.

5. The production method of semiconductor device as claimed in claim 1, wherein the polymer compound (A) is one selected from the group consisting of a (meth)acrylic polymer, a styrene polymer, a polyurethane resin, a polyvinyl alcohol resin, a polyvinyl acetal resin, a polyvinyl formal resin, a polyamide resin, a polyester resin, an epoxy resin and a novolac resin, and the content of the repeating unit having a radical polymerizable group is 5% by mole to 50% by mole.

* * * * *